(12) United States Patent
Hyun et al.

(10) Patent No.: US 10,580,474 B2
(45) Date of Patent: Mar. 3, 2020

(54) SEMICONDUCTOR DEVICES

(71) Applicant: SK hynix Inc., Icheon-si, Gyeonggi-do (KR)

(72) Inventors: Sang Ah Hyun, Chungju-si (KR); Yunyoung Lee, Icheon-si (KR); Seok Bo Shim, Hwaseong-si (KR); Sang Ho Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/810,820

(22) Filed: Nov. 13, 2017

(65) Prior Publication Data

US 2018/0366182 A1    Dec. 20, 2018

(30) Foreign Application Priority Data

Jun. 14, 2017    (KR) ........................ 10-2017-0074946

(51) Int. Cl.

| | | |
|---|---|---|
| *G11C 11/40* | (2006.01) | |
| *G11C 11/406* | (2006.01) | |
| *G11C 11/419* | (2006.01) | |
| *G11C 11/418* | (2006.01) | |
| *G11C 29/50* | (2006.01) | |

(Continued)

(52) U.S. Cl.

CPC ...... *G11C 11/40615* (2013.01); *G11C 11/418* (2013.01); *G11C 11/419* (2013.01); *G11C 29/18* (2013.01); *G11C 29/50016* (2013.01); *G11C 11/408* (2013.01); *G11C 11/4072* (2013.01); *G11C 29/10* (2013.01); *G11C 2211/4068* (2013.01)

(58) Field of Classification Search
CPC ............ G11C 11/40615; G11C 11/418; G11C 11/419; G11C 29/10
See application file for complete search history.

(56) References Cited

U.S. PATENT DOCUMENTS

2014/0070212 A1* 3/2014 Fujiwara ............ G06K 19/0722
257/48
2014/0269123 A1* 9/2014 Kim .................. G11C 11/40618
365/200

(Continued)

FOREIGN PATENT DOCUMENTS

KR    1020160069430 A    6/2016

*Primary Examiner* — Mohammed A Bashar
(74) *Attorney, Agent, or Firm* — William Park & Associates Ltd.

(57) ABSTRACT

A semiconductor device may include a refresh control circuit which may generate test addresses that are counted based on a refresh signal and a detection clock signal and may senses logic levels of internal data corresponding to the test addresses to generate a sense signal. The semiconductor device may include a memory circuit may include a plurality of word lines which are selected by the test addresses and may output the internal data stored in memory cells connected to the word lines. The semiconductor device may include an address storage circuit may divide each of the test addresses into a main group and a sub-group to store the main groups and the sub-groups of the test addresses. The address storage circuit may store the sub-groups which are inputted at a point of time that the sense signal is generated, regarding the stored main groups having the same level combination.

19 Claims, 14 Drawing Sheets

(51) Int. Cl.
  *G11C 29/18* (2006.01)
  *G11C 29/10* (2006.01)
  *G11C 11/4072* (2006.01)
  *G11C 11/408* (2006.01)

(56) References Cited

U.S. PATENT DOCUMENTS

2015/0162065 A1   6/2015  Kim et al.
2015/0221361 A1*  8/2015  Lee et al. ............... G11C 17/16
                                                 365/96

* cited by examiner

FIG. 7

| MSL<3> | MSL<2> | MSL<1> | MIN<1> | MIN<2> | MIN<3> | MIN<4> | MIN<5> | MIN<6> | MIN<7> | MIN<8> |
|---|---|---|---|---|---|---|---|---|---|---|
| L | L | L | H | L | L | L | L | L | L | L |
| L | L | H | L | H | L | L | L | L | L | L |
| L | H | L | L | L | H | L | L | L | L | L |
| L | H | H | L | L | L | H | L | L | L | L |
| H | L | L | L | L | L | L | H | L | L | L |
| H | L | H | L | L | L | L | L | H | L | L |
| H | H | L | L | L | L | L | L | L | H | L |
| H | H | H | L | L | L | L | L | L | L | H |

FIG. 8

| SSL<2> | SSL<1> | SIN<1> | SIN<2> | SIN<3> | SIN<4> |
|---|---|---|---|---|---|
| L | L | H | L | L | L |
| L | H | L | H | L | L |
| H | L | L | L | H | L |
| H | H | L | L | L | H |

FIG. 9

| MSL<6> | MSL<5> | MSL<4> | MOUT<1> | MOUT<2> | MOUT<3> | MOUT<4> | MOUT<5> | MOUT<6> | MOUT<7> | MOUT<8> |
|---|---|---|---|---|---|---|---|---|---|---|
| L | L | L | H | L | L | L | L | L | L | L |
| L | L | H | L | H | L | L | L | L | L | L |
| L | H | L | L | L | H | L | L | L | L | L |
| L | H | H | L | L | L | H | L | L | L | L |
| H | L | L | L | L | L | L | H | L | L | L |
| H | L | H | L | L | L | L | L | H | L | L |
| H | H | L | L | L | L | L | L | L | H | L |
| H | H | H | L | L | L | L | L | L | L | H |

FIG. 10

| SSL<4> | SSL<3> | SOUT<1> | SOUT<2> | SOUT<3> | SOUT<4> |
|---|---|---|---|---|---|
| L | L | H | L | L | L |
| L | H | L | H | L | L |
| H | L | L | L | H | L |
| H | H | L | L | L | H |

SEMICONDUCTOR DEVICES

CROSS-REFERENCE TO RELATED APPLICATIONS

The present application claims priority under 35 U.S.C 119(a) to Korean Patent Application No. 10-2017-0074946, filed on Jun. 14, 2017, which is herein incorporated by references in its entirety.

BACKGROUND

1. Technical Field

Embodiments of the present disclosure may generally relate to semiconductor devices relating to a refresh operation.

2. Related Art

Semiconductor devices, such as dynamic random access memory (DRAM) devices, may include a plurality of memory cells for storing data. Each of the DRAM cells may be configured to include a cell capacitor and a cell transistor. The DRAM devices may store data therein by discharging or charging the cell capacitors. Once the cell capacitor is charged or discharged to store a datum therein, an amount of electric charges stored in the cell capacitor has to be constant, ideally, even though time elapses. However, the amount of electric charges stored in the cell capacitor may actually vary because of a voltage difference between the cell capacitor and a circuit adjacent to the cell capacitor or because of a leakage current of the cell capacitor. In particular, if the amount of electric charges stored in the cell capacitor is reduced, the cell capacitor may lose a datum stored therein causing malfunction of the DRAM device. Thus, the DRAM devices may require a refresh operation to prevent the memory cells from losing their data.

As the semiconductor devices become more highly integrated with the development of process technologies, a distance between the memory cells as well as a distance between word lines connected to the memory cells has been continuously reduced. If a distance between the word lines is reduced, data stored in the adjacent memory cells may be changed due to a coupling phenomenon or an interference phenomenon between the word lines. Accordingly, it may be necessary to apply a refresh operation.

SUMMARY

According to an embodiment, a semiconductor device may be provided. The semiconductor device may include a refresh control circuit, a memory circuit, and an address storage circuit. The refresh control circuit may be configured to generate test addresses that are counted based on a refresh signal and a detection clock signal, and may sense logic levels of internal data corresponding to the test addresses to generate a sense signal. The memory circuit may include a plurality of word lines which are selected by the test addresses and may output the internal data stored in memory cells connected to the word lines. The address storage circuit may be configured to divide each of the test addresses into a main group and a sub-group to store the main groups and the sub-groups of the test addresses. The address storage circuit may be configured to store the sub-groups which may be inputted at a point of time that the sense signal is generated, regarding the stored main groups having the same level combination.

According to an embodiment, a semiconductor device may be provided. The semiconductor device may include a refresh control circuit, a memory circuit, and an address storage circuit. The refresh control circuit may be configured to generate test addresses that are counted based on a refresh signal and a detection clock signal, and may sense logic levels of internal data corresponding to the test addresses to generate a sense signal. The memory circuit may include a plurality of word lines which are selected by the test addresses. The memory circuit may be configured to output the internal data stored in memory cells connected to the word lines. The memory circuit may be configured to perform a refresh operation of weak cells according to a weak cell address based on an internal refresh signal. The address storage circuit may be configured to divide each of the test addresses into a main group and a sub-group to store the main groups and the sub-groups of the test addresses. The address storage circuit may be configured to store the sub-groups which may be inputted at a point of time that the sense signal is generated, regarding the stored main groups having the same level combination. The address storage circuit may be configured to output each of the stored test address as the weak cell address based on an enablement signal.

BRIEF DESCRIPTION OF THE DRAWINGS

FIGS. 7 and 8 are tables illustrating operations of a first decoder included in the weak cell address storage circuit of FIG. 6.

FIGS. 9 and 10 are tables illustrating operations of a second decoder included in the weak cell address storage circuit of FIG. 6.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed at applying an additional refresh operation to weak memory cells.

For reference, an embodiment including additional components may be provided. Furthermore, a logic high or logic low configuration indicating a level combination of a signal may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

For reference, an embodiment including additional components may be provided. Furthermore, a logic high or logic low configuration indicating a logic state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

Figure 1:
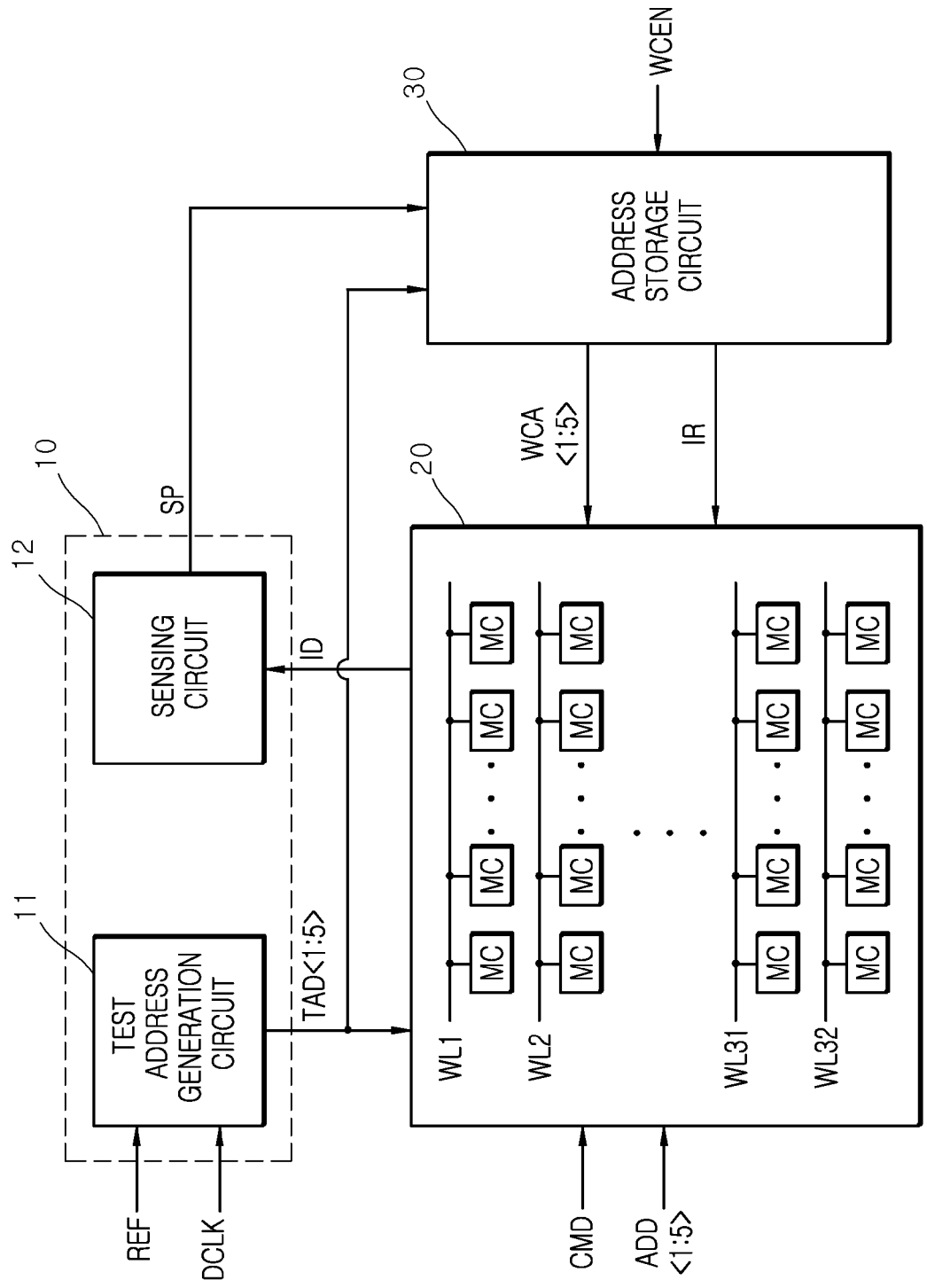
FIG. 1 is a block diagram illustrating a configuration of a semiconductor device according to an embodiment of the present disclosure.

Referring to FIG. 1, a semiconductor device according to an embodiment may include a refresh control circuit 10, a memory circuit 20, and an address storage circuit 30. The refresh control circuit 10 may include a test address generation circuit 11 and a sensing circuit 12.

The test address generation circuit 11 may generate a five-bit test address TAD<1:5> which is counted in response to a refresh signal REF and a detection clock signal DCLK. The test address generation circuit 11 may generate the test address TAD<1:5> which is sequentially counted in response to the refresh signal REF if the detection clock signal DCLK is toggled. Although the test address TAD<1:5> is set to have five bits in an embodiment, the number of bits included in the test address may be set to be different according to the embodiments. The refresh signal REF may be transmitted through lines that transmit at least one group of addresses, commands, and data. The refresh signal REF may correspond to a signal for performing a refresh operation. The refresh signal REF may be generated from a command CMD provided by an external device.

The sensing circuit 12 may sense logic levels of internal data ID corresponding to the test address TAD<1:5> to generate a sense signal SP. The sensing circuit 12 may generate the sense signal SP including a pulse which is created if the logic levels of the internal data ID are inconsistent with a predetermined logic level. The sensing circuit 12 may generate the sense signal SP including a pulse which is created if the logic levels of the internal data ID are not a logic "high" level. The predetermined logic level for creating the pulse of the sense signal SP may be set to be a logic "low" level in some embodiments. The internal data ID corresponding to the test address TAD<1:5> mean data which are outputted from memory cells MCs connected to first to thirty second word lines (WL1~WL32 in the memory circuit 20), one of which is selected by the test address TAD<1:5>. The test address TAD<1:5> for outputting the internal data ID creating the pulse of the sense signal SP may include information on positions of weak cells. The weak cells mean memory cells whose data retention time is shorter than a predetermined retention time. The predetermined retention time may be set to be different according to the embodiments. In addition, the weak cells may mean memory cells that lose their data within the predetermined retention time among the memory cells MCs connected to at least one word line adjacent to a certain word line of the first to thirty second word lines WL1~WL32 when the certain word line is selected and activated. For example, if the fifteenth word line WL15 adjacent to the sixteenth word line WL16 is repeatedly activated, a level of the sixteenth word line WL16 may vary to cause change of a logic level of datum stored in at least one of the memory cells MCs connected to the sixteenth word line WL16. In such a case, the at least one memory cell storing the datum whose logic level is changed among the memory cells connected to the sixteenth word line WL16 may correspond to the weak cells.

The refresh control circuit 10 described above may output the test address TAD<1:5> which is counted in response to the refresh signal REF and the detection clock signal DCLK. The refresh control circuit 10 may sense logic levels of the internal data ID corresponding to the test address TAD<1:5> to generate the sense signal SP.

The memory circuit 20 may include the first to thirty second word lines WL1~WL32, one of which is selected by the test address TAD<1:5> during the refresh operation. The memory circuit 20 may include the plurality of memory cells MCs connected to the first to thirty second word lines WL1~WL32. The memory circuit 20 may output the internal data ID by activating the first to thirty second word lines WL1~WL32, one of which is selected by the test address TAD<1:5> during the refresh operation. The memory circuit 20 may activate the first to thirty second word lines WL1~WL32, one of which is selected by a five-bit weak cell address WCA<1:5>, in response to an internal refresh signal IR during the refresh operation. The memory circuit 20 may perform a normal operation in response to the command CMD. The memory circuit 20 may include the first to thirty second word lines WL1~WL32, one of which is selected by a five-bit address ADD<1:5> during the normal operation. The memory circuit 20 may receive or output the internal data ID by activating one of the first to thirty second word lines WL1~WL32 according to a level combination of the address ADD<1:5> during the normal operation. The command CMD and the address ADD<1:5> may be transmitted through lines that transmit at least one group of addresses, commands and data. Although the address ADD<1:5> is set to have five bits in an embodiment, the number of bits included in the addresses may be set to be different according to the embodiments. The internal refresh signal IR may be enabled to periodically perform the refresh operation of the weak cells on, for example but not limited to, a cycle time which is half a cycle time of the refresh operation of normal memory cells. The memory circuit 20 may be realized using a general volatile memory device or a general nonvolatile memory device.

The address storage circuit 30 may store the test address TAD<1:5> therein in response to an enablement signal WCEN and the sense signal SP. The address storage circuit 30 may divide the test address TAD<1:5> into a main group TAD<1:3> and a sub-group TAD<4:5> and may store the main group TAD<1:3> and the sub-group TAD<4:5> therein. The address storage circuit 30 may store the main group TAD<1:3> and the sub-group TAD<4:5> corresponding to a level combination of the main group TAD<1:3> at a point of time that the sense signal SP is generated. The enablement signal WCEN may be set as a signal for activating each of the word lines connected to the weak cells in a time period which is, for example but not limited to, half a time period for activating each of the word lines during a normal refresh operation of the normal memory cells. That is, the enablement signal WCEN may be a signal for activating each of the word lines connected to the weak cells twice during a time period for activating each of the word lines connected to the normal memory cells once.

Figure 2:
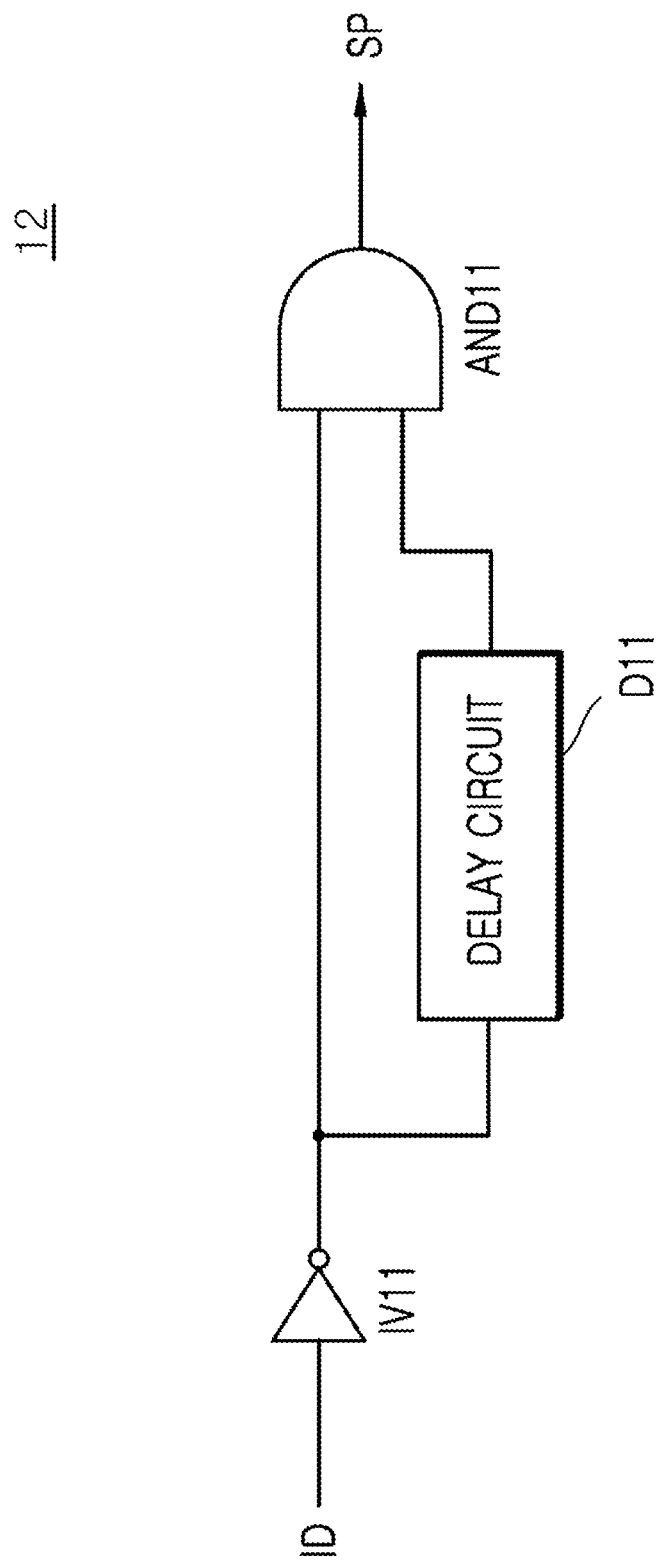
FIG. 2 illustrates a configuration of a sensing circuit included in the semiconductor device of FIG. 1.

Referring to FIG. 2, the sensing circuit 12 may be configured to include, for example but not limited to an inverter IV11, a delay circuit D11, and an AND gate AND11.

The sensing circuit 12 may sense logic levels of the internal data ID to generate the sense signal SP. The sensing circuit 12 may generate the sense signal SP including a pulse which are created if a logic level of the internal data ID changes from a logic "high(H)" level into a logic "low(L)" level. The pulse included in the sense signal SP may be created to have a logic "high(H)" level. Although the sensing circuit 12 is configured to sense a case that a logic level of the internal data ID is a logic "low(L)" level, the sensing circuit 12 may be configured to sense a case that a logic level of the internal data ID is a logic "high(H)" level in some embodiments. In an embodiment, for example, the sense signal SP may include a pulse which is created if a logic level of the internal data ID is different from a predetermined logic level. The sensing circuit 12 may be realized using a general pulse generation circuit.

Figure 3:
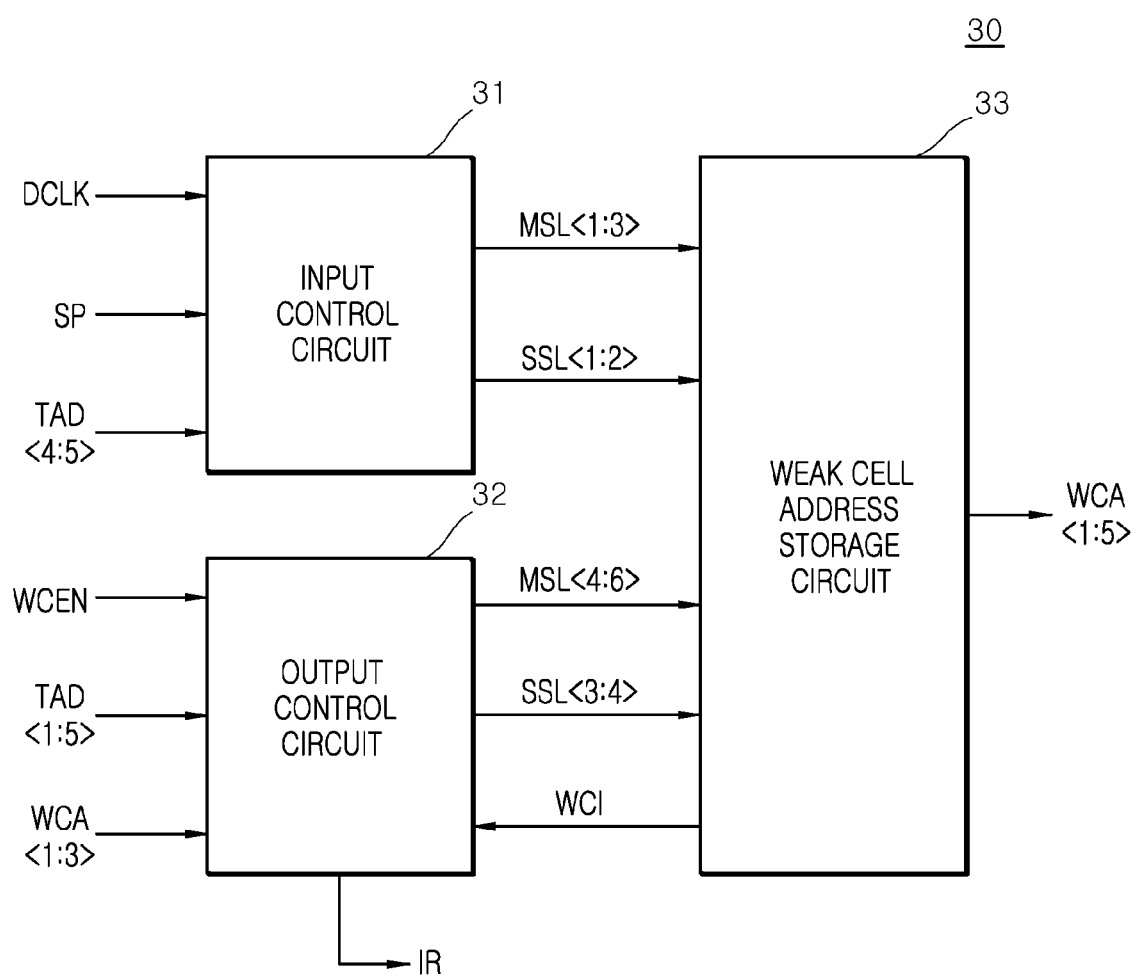
FIG. 3 is a block diagram illustrating a configuration of an address storage circuit included in the semiconductor device of FIG. 1.

Referring to FIG. 3, the address storage circuit 30 may include an input control circuit 31, an output control circuit 32, and a weak cell address storage circuit 33.

The input control circuit 31 may generate first to third main selection signals MSL<1:3> which are sequentially counted if the fourth and fifth bits TAD<4:5> have a predetermined level combination in response to the detection clock signal DCLK and the sense signal SP. The input control circuit 31 may generate first and second sub-selection signals SSL<1:2> which are sequentially counted in response to the sense signal SP.

The output control circuit 32 may compare the first to third bits TAD<1:3> of the test address TAD<1:5> with the first to third bits WCA<1:3> of the weak cell address WCA<1:5> in response to the enablement signal WCEN to generate the internal refresh signal IR. The output control circuit 32 may compare the first to third bits TAD<1:3> of the test address TAD<1:5> with the first to third bits WCA<1:3> of the weak cell address WCA<1:5> in response to the enablement signal WCEN to generate fourth to sixth main selection signals MSL<4:6> which are sequentially counted. The output control circuit 32 may generate third and fourth sub-selection signals SSL<3:4> which are counted in response to the internal refresh signal IR. The output control circuit 32 may generate the third and fourth sub-selection signals SSL<3:4> which are counted if the fourth and fifth bits TAD<4:5> have a predetermined level combination. The output control circuit 32 may generate the internal refresh signal IR which is enabled in response to the weak cell information signal WCI if the sub-group TAD<4:5> of the test address TAD<1:5> has a predetermined level combination.

The weak cell address storage circuit 33 may store the main group TAD<1:3> and the sub-group TAD<4:5> of the test address TAD<1:5> in response to the first and second sub-selection signals SSL<1:2> regarding each of level combinations of the first to third main selection signals MSL<1:3>. The weak cell address storage circuit 33 may output the stored test address TAD<1:5> as the weak cell address WCA<1:5> in response to the third and fourth sub-selection signals SSL<3:4> regarding each of level combinations of the fourth to sixth main selection signals MSL<4:6>. In an embodiment, for example, the weak cell address storage circuit 33 may store the main group TAD<1:3> and the sub-group TAD<4:5> of the test address TAD<1:5> as a weak cell address in response to the first and second sub-selection signals SSL<1:2> regarding each of level combinations of the first to third main selection signals MSL<1:3>. In an embodiment, for example, the weak cell address storage circuit 33 may output weak cell information WCI according to the sense signal SP if the sub-group TAD<4:5> of the test address TAD<1:5> has a predetermined level combination.

Figure 4:
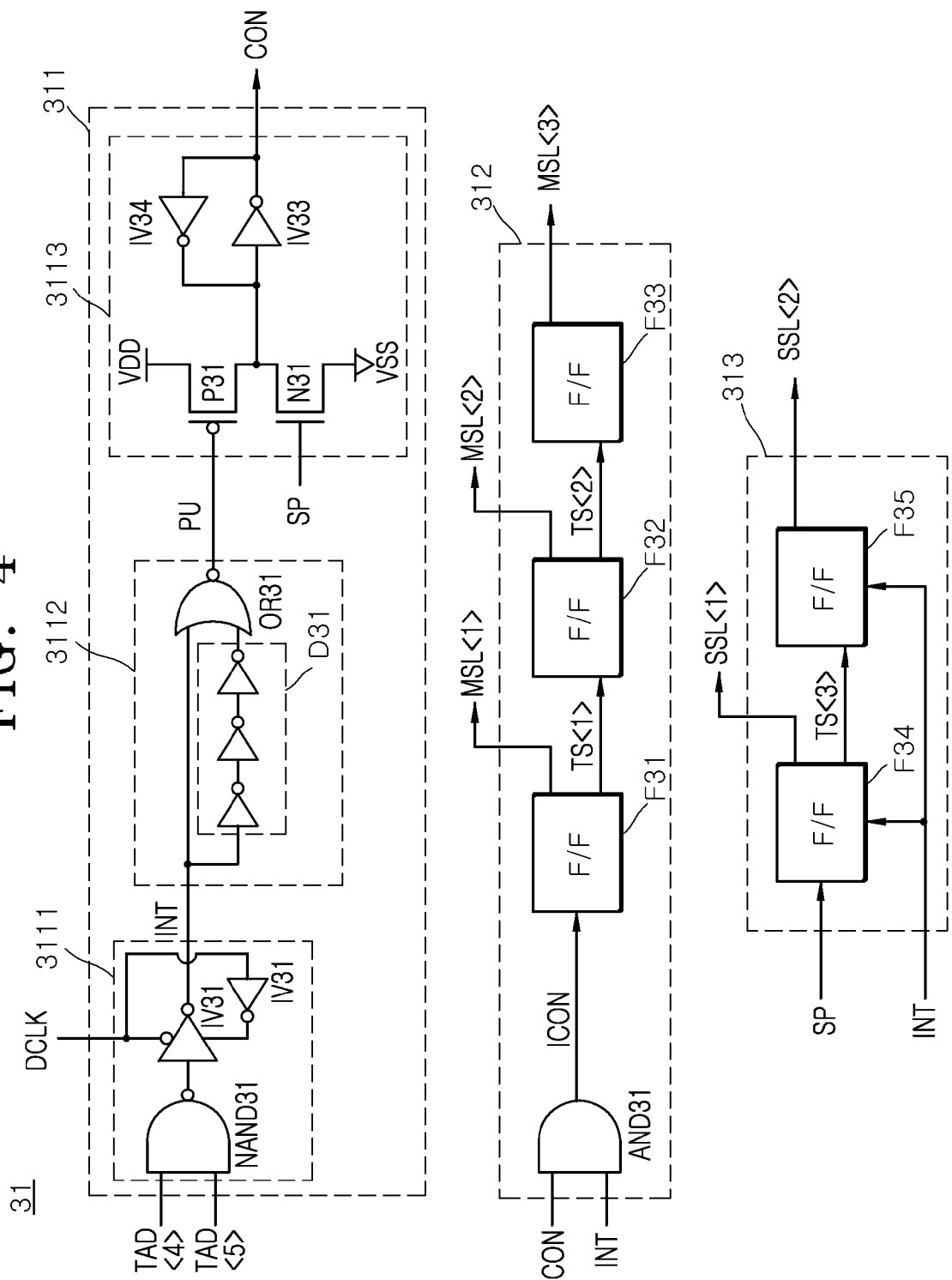
FIG. 4 is a circuit diagram illustrating a configuration of an input control circuit included in the address storage circuit of FIG. 3.

Referring to FIG. 4, the input control circuit 31 may include a control signal generation circuit 311, a first main selection signal generation circuit 312, and a first sub-selection signal generation circuit 313. The control signal generation circuit 311 may include an initialization signal generation circuit 3111, a pull-up signal generation circuit 3112, and a driving circuit 3113.

The initialization signal generation circuit 3111 may be realized using logic operators, for example but not limited to, a NAND gate NAND31 and inverters IV31 and IV32. The initialization signal generation circuit 3111 may generate an initialization signal INT which is enabled if the fourth and fifth bits TAD<4:5> have a predetermined level combination in response to the detection clock signal DCLK. The initialization signal generation circuit 3111 may generate the initialization signal INT which is enabled to have a logic "high(H)" level if the fourth and fifth bits TAD<4:5> have a level combination of 'H,H' at a point of time that a level of the detection clock signal DCLK changes into a logic "low(L)" level. In the fourth and fifth bits TAD<4:5>, a level combination of 'H,H' means that the fourth bit TAD<4> has a logic "high(H)" level and the fifth bit TAD<5> has a logic "high(H)" level.

The pull-up signal generation circuit 3112 may be realized using, for example but not limited to, a delay circuit D31 and an OR gate OR31. The pull-up signal generation circuit 3112 may generate a pull-up signal PU including a pulse which is created in response to the initialization signal INT. The pull-up signal generation circuit 3112 may generate the pull-up signal PU including a pulse which is created if a level of the initialization signal INT changes from a logic "high(H)" level into a logic "low(L)" level. The pulse of the pull-up signal PU may be set to have a logic "low(L)" level.

The driving circuit 3113 may be realized using, for example but not limited to, a PMOS transistor P31, an NMOS transistor N31, and inverters IV33 and IV34. The driving circuit 3113 may generate a control signal CON which is disabled in response to the pull-up signal PU and which is enabled in response to the sense signal SP. The driving circuit 3113 may generate the control signal CON which is disabled to have a logic "low(L)" level if the pull-up signal PU has a logic "low(L)" level. The driving circuit 3113 may generate the control signal CON which is enabled to have a logic "high(H)" level if the sense signal SP has a logic "high(H)" level. In an embodiment, for example, the control signal generation circuit 311 may be configured to generate an initialization signal INT which may be enabled if a sub-group TAD<4:5> of the test address TAD<1:5> has a predetermined level combination and may be configured to generate a control signal CON which is enabled in response to the initialization signal INT.

The first main selection signal generation circuit 312 may be realized using, for example but not limited to, an AND gate AND31 and flip-flops F31, F32, and F33.

The AND gate AND31 may perform an AND operation of the initialization signal INT and the control signal CON to generate an internal control signal ICON. The AND gate AND31 may generate the internal control signal ICON having a logic "high(H)" level if the initialization signal INT and the control signal CON have a logic "high(H)" level.

The flip-flop F31 may generate the first main selection signal MSL<1>, level transition of which occurs at a point of time that a level of the internal control signal ICON changes from a logic "high(H)" level into a logic "low(L)" level. The flip-flop F31 may also invert the first main selection signal MSL<1> to generate a first transmission signal TS<1> corresponding to a complementary signal of the first main selection signal MSL<1>.

The flip-flop F32 may generate the second main selection signal MSL<2>, level transition of which occurs at a point of time that a level of the first transmission signal TS<1> changes from a logic "high(H)" level into a logic "low(L)" level. The flip-flop F32 may also invert the second main selection signal MSL<2> to generate a second transmission signal TS<2> corresponding to a complementary signal of the second main selection signal MSL<2>.

The flip-flop F33 may generate the third main selection signal MSL<3>, level transition of which occurs at a point of time that a level of the second transmission signal TS<2> changes from a logic "high(H)" level into a logic "low(L)" level.

The first sub-selection signal generation circuit 313 may be realized using, for example but not limited to, flip-flops F34 and F35.

The flip-flop F34 may generate the first sub-selection signal SSL<1> which is initialized to have a logic "low(L)" level if the initialization signal INT having a logic "high(H)" level is inputted to the flip-flop F34. The flip-flop F34 may generate the first sub-selection signal SSL<1>, level transition of which occurs at a point of time that a level of the sense signal SP changes from a logic "high(H)" level into a logic "low(L)" level. The flip-flop F34 may also invert the first sub-selection signal SSL<1> to generate a third transmission signal TS<3> corresponding to a complementary signal of the first sub-selection signal SSL<1>.

The flip-flop F35 may generate the second sub-selection signal SSL<2> which is initialized to have a logic "low(L)" level if the initialization signal INT having a logic "high(H)" level is inputted to the flip-flop F35. The flip-flop F35 may generate the second sub-selection signal SSL<2>, level transition of which occurs at a point of time that a level of the third transmission signal TS<3> changes from a logic "high(H)" level into a logic "low(L)" level.

Figure 5:
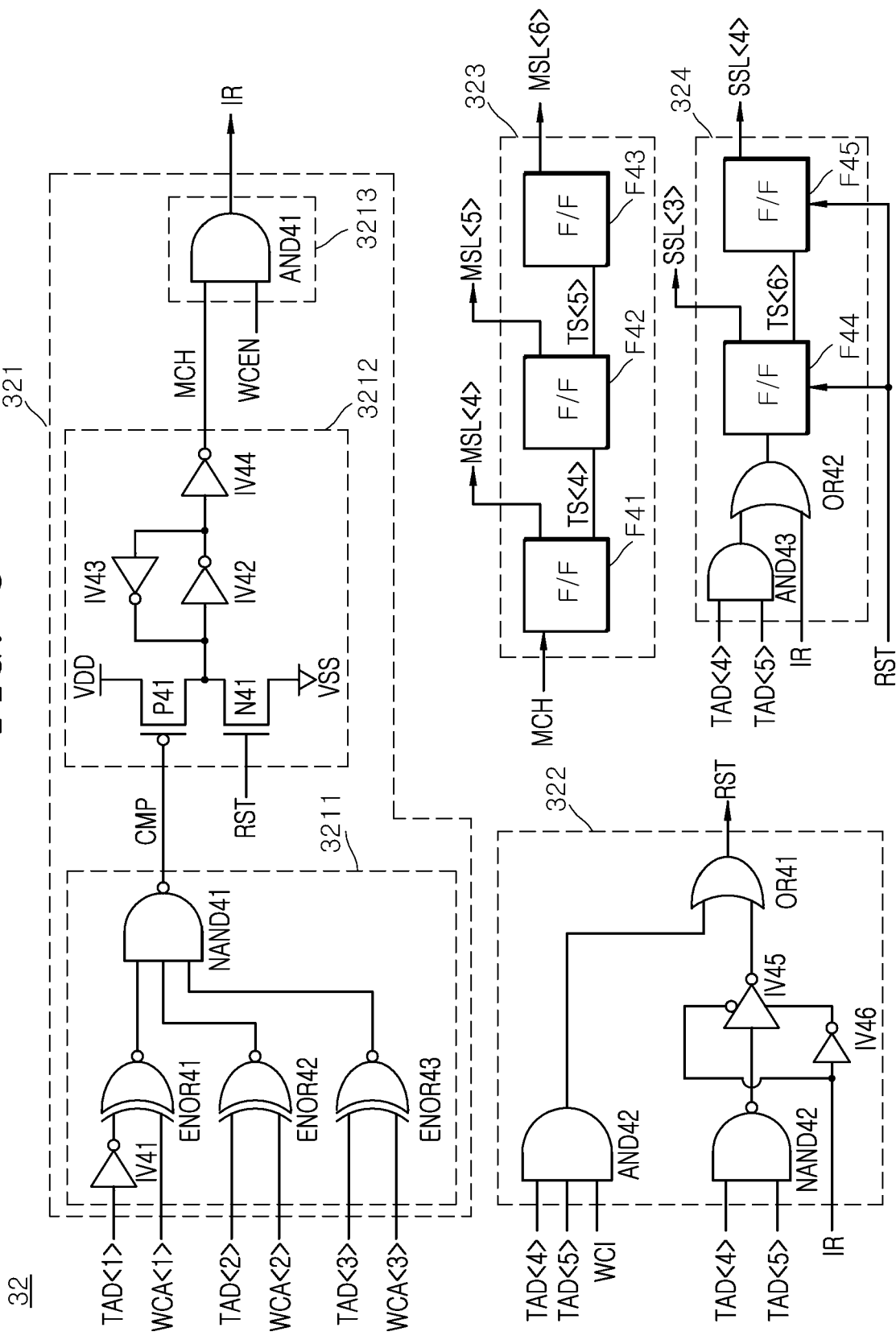
FIG. 5 is a circuit diagram illustrating a configuration of an output control circuit included in the address storage circuit of FIG. 3.

Referring to FIG. 5, the output control circuit 32 may include an internal refresh signal generation circuit 321, a reset signal generation circuit 322, a second main selection signal generation circuit 323, and a second sub-selection signal generation circuit 324. The internal refresh signal generation circuit 321 may include a comparison signal generation circuit 3211, a match signal generation circuit 3212, and a logic circuit 3213.

The comparison signal generation circuit 3211 may be realized using, for example but not limited to, an inverter IV41, exclusive NOR gates ENOR41, ENOR42 and ENOR43, and a NAND gate NAND41. The comparison signal generation circuit 3211 may compare the main group TAD<1:3> of the test address TAD<1:5> with a main group WCA<1:3> of the weak cell address WCA<1:5> to generate a comparison signal CMP. The comparison signal generation circuit 3211 may generate the comparison signal CMP which is enabled to have a logic "low(L)" level if a complementary signal of the first bit TAD<1> of the test address TAD<1:5> has the same logic level as the first bit WCA<1> of the weak cell address WCA<1:5>, the second bit TAD<2> of the test address TAD<1:5> has the same logic level as the second bit WCA<2> of the weak cell address WCA<1:5>, and the third bit TAD<3> of the test address TAD<1:5> has the same logic level as the third bit WCA<3> of the weak cell address WCA<1:5>. The reason for comparing a complementary signal of the first bit TAD<1> of the test address TAD<1:5> with the first bit WCA<1> of the weak cell address WCA<1:5> is for performing a refresh operation of the weak cells on a cycle time which is half a cycle time of a normal refresh operation for normal memory cells because the probability that data of the weak cells are lost is higher than the probability that data of the normal cells are lost during the refresh operation which is performed while the test address TAD<1:5> is sequentially counted. For example, the reason for comparing a complementary signal of the first bit TAD<1> of the test address TAD<1:5> with the first bit WCA<1> of the weak cell address WCA<1:5> is for performing an additional refresh operation by activating the seventeenth word line WL17 connected to the weak cells if the first word line WL1 is activated by the test address TAD<1:5>.

The match signal generation circuit 3212 may be realized using, for example but not limited to, a PMOS transistor P41, an NMOS transistor N41 and inverters IV42, IV43, and IV44. The match signal generation circuit 3212 may generate a match signal MCH which is enabled in response to the comparison signal CMP and which is disabled in response to a reset signal RST. The match signal generation circuit 3212 may generate the match signal MCH which is enabled to have a logic "high(H)" level if the comparison signal CMP having a logic "low(L)" level in inputted to the match signal generation circuit 3212. The match signal generation circuit 3212 may generate the match signal MCH which is disabled to have a logic "low(L)" level if the reset signal RST having a logic "high(H)" level in inputted to the match signal generation circuit 3212.

The logic circuit 3213 may be realized using, for example but not limited to, an AND gate AND41. The logic circuit 3213 may generate the internal refresh signal IR in response to the match signal MCH and the enablement signal WCEN. The logic circuit 3213 may perform an AND operation of the match signal MCH and the enablement signal WCEN to generate the internal refresh signal IR. The logic circuit 3213 may generate the internal refresh signal IR which is enabled to have a logic "high(H)" level if the match signal MCH has a logic "high(H)" level and the enablement signal WCEN has a logic "high(H)" level.

As described above, the internal refresh signal generation circuit 321 may compare the main group TAD<1:3> of the test address TAD<1:5> with the main group WCA<1:3> of the weak cell address WCA<1:5> to generate the internal refresh signal IR.

The reset signal generation circuit 322 may be realized using, for example but not limited to, an AND gate AND42, a NAND gate NAND42, inverters IV45 and IV46, and an OR gate OR41. The reset signal generation circuit 322 may generate the reset signal RST which is enabled in response to the weak cell information signal WCI if the sub-group TAD<4:5> of the test address TAD<1:5> has a predetermined level combination. The reset signal generation circuit 322 may generate the reset signal RST which is enabled to have a logic "high(H)" level if the sub-group TAD<4:5> of the test address TAD<1:5> has a logic "high(H)" level and the weak cell information signal WCI has a logic "high(H)" level. The reset signal generation circuit 322 may generate the reset signal RST which is enabled in response to the internal refresh signal IR if the sub-group TAD<4:5> of the test address TAD<1:5> has a predetermined level combination. The reset signal generation circuit 322 may generate the reset signal RST which is enabled to have a logic "high(H)" level if the sub-group TAD<4:5> of the test address TAD<1:5> has a logic "high(H)" level and the internal refresh signal IR has a logic "low(L)" level.

The second main selection signal generation circuit 323 may be realized using flip-flops F41, F42, and F43.

The flip-flop F41 may generate the fourth main selection signal MSL<4>, level transition of which occurs at a point of time that a level of the match signal MCH changes from a logic "high(H)" level into a logic "low(L)" level. The flip-flop F41 may also invert the fourth main selection signal MSL<4> to generate a fourth transmission signal TS<4> corresponding to a complementary signal of the fourth main selection signal MSL<4>.

The flip-flop F42 may generate the fifth main selection signal MSL<5>, level transition of which occurs at a point of time that a level of the fourth transmission signal TS<4> changes from a logic "high(H)" level into a logic "low(L)" level. The flip-flop F42 may also invert the fifth main selection signal MSL<5> to generate a fifth transmission signal TS<5> corresponding to a complementary signal of the fifth main selection signal MSL<5>.

The flip-flop F43 may generate the sixth main selection signal MSL<6>, level transition of which occurs at a point of time that a level of the fifth transmission signal TS<5> changes from a logic "high(H)" level into a logic "low(L)" level.

As described above, the second main selection signal generation circuit 323 may generate the fourth to sixth main selection signals MSL<4:6> which are counted if a level of the match signal MCH changes from a logic "high(H)" level into a logic "low(L)" level.

The second sub-selection signal generation circuit 324 may be realized using, for example but not limited to, an AND gate AND43, an OR gate OR42, and flip-flops F44 and F45.

The AND gate AND43 may perform an AND operation of a fourth bit TAD<4> and a fifth bit TAD<5> included in the sub-group TAD<4:5> of the test address TAD<1:5> to output the result of the AND operation.

The OR gate OR42 may perform an OR operation of an output signal of the AND gate AND43 and the internal refresh signal IR to output the result of the OR operation.

The flip-flop F44 may generate the third sub-selection signal SSL<3> which is initialized to have a logic "low(L)" level if the reset signal RST having a logic "high(H)" level is inputted to the flip-flop F44. The flip-flop F44 may generate the third sub-selection signal SSL<3>, level transition of which occurs at a point of time that a level of an output signal of the OR gate OR42 changes from a logic "high(H)" level into a logic "low(L)" level. The flip-flop F44 may also invert the third sub-selection signal SSL<3> to generate a sixth transmission signal TS<6> corresponding to a complementary signal of the third sub-selection signal SSL<3>.

The flip-flop F45 may generate the fourth sub-selection signal SSL<4> which is initialized to have a logic "low(L)" level if the reset signal RST having a logic "high(H)" level is inputted to the flip-flop F45. The flip-flop F45 may generate the fourth sub-selection signal SSL<4>, level transition of which occurs at a point of time that a level of the sixth transmission signal TS<6> changes from a logic "high(H)" level into a logic "low(L)" level.

As described above, the second sub-selection signal generation circuit 324 may generate the third and fourth sub-selection signals SSL<3:4> which are initialized in response to the reset signal RST. The second sub-selection signal generation circuit 324 may generate the third and fourth sub-selection signals SSL<3:4> which are counted if the sub-group TAD<4:5> of the test address TAD<1:5> has a predetermined level combination. The second sub-selection signal generation circuit 324 may generate the third and fourth sub-selection signals SSL<3:4> which are counted if the internal refresh signal IR is enabled.

Figure 6:
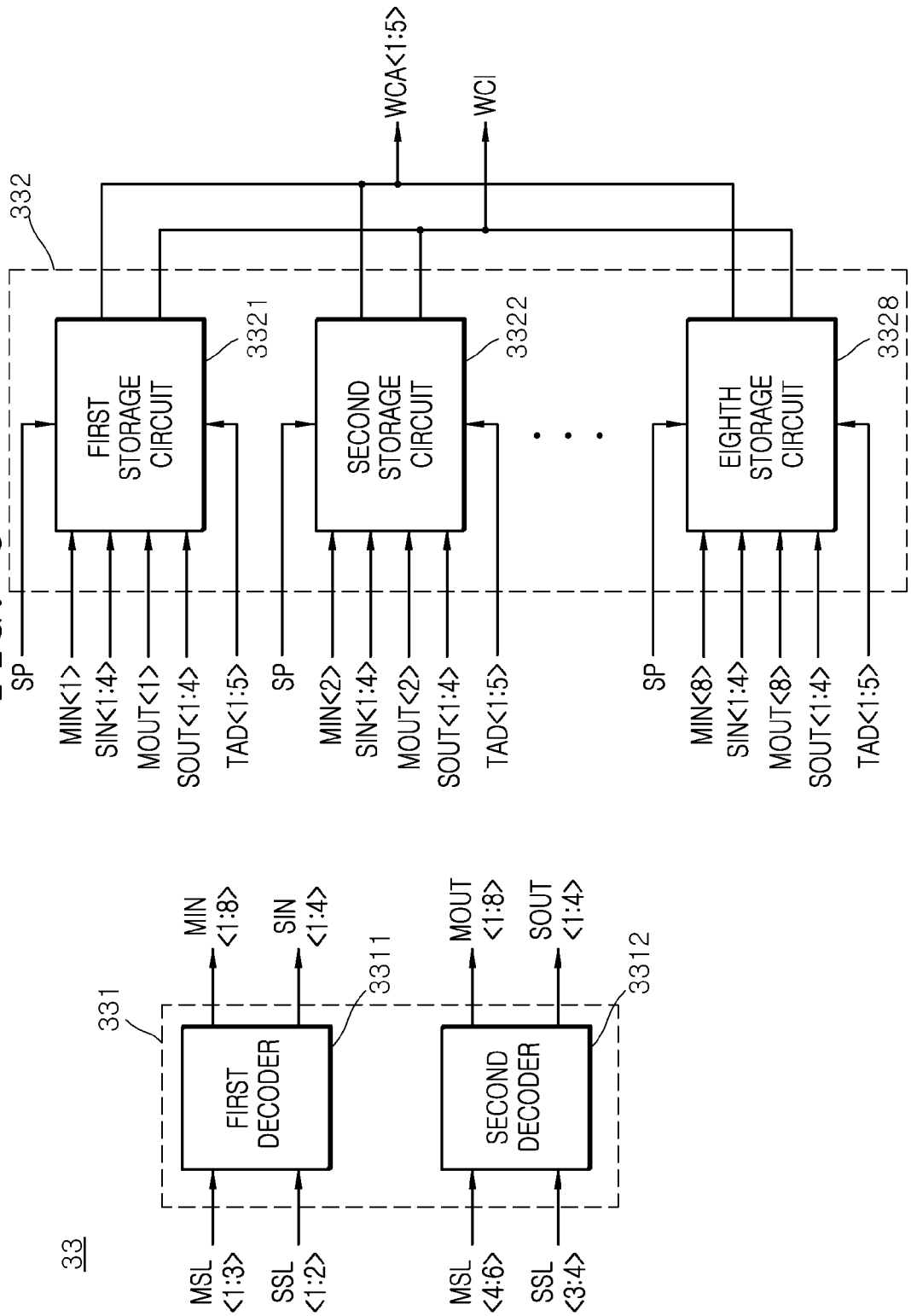
FIG. 6 is a block diagram illustrating a configuration of a weak cell address storage circuit included in the address storage circuit of FIG. 3.

Referring to FIG. 6, the weak cell address storage circuit 33 may include an input and output (input/output) (I/O) signal generation circuit 331 and a weak cell address generation circuit 332. The I/O signal generation circuit 331 may include a first decoder 3311 and a second decoder 3312. The weak cell address generation circuit 332 may include first to eighth storage circuits 3321~3328.

The first decoder 3311 may decode the first to third main selection signals MSL<1:3> to generate first to eighth main input signals MIN<1:8>, one of which is selectively enabled. The first decoder 3311 may decode the first and second sub-selection signals SSL<1:2> to generate first to fourth sub-input signals SIN<1:4>, one of which is selectively enabled. Operations of the first decoder 3311 generating the first to eighth main input signals MIN<1:8> and the first to fourth sub-input signals SIN<1:4> will be described below with reference to FIGS. 7 and 8 later.

The second decoder 3312 may decode the fourth to sixth main selection signals MSL<4:6> to generate first to eighth main output signals MOUT<1:8>, one of which is selectively enabled. The second decoder 3312 may decode the third and fourth sub-selection signals SSL<3:4> to generate first to fourth sub-output signals SOUT<1:4>, one of which is selectively enabled. Operations of the second decoder 3312 generating the first to eighth main output signals MOUT<1:8> and the first to fourth sub-output signals SOUT<1:4> will be described below with reference to FIGS. 9 and 10 later.

The first storage circuit 3321 may store the main group TAD<1:3> having a first level combination and the sub-group TAD<4:5>, which are included in the test address TAD<1:5>, in response to the first to fourth sub-input signals SIN<1:4> if the first main input signal MIN<1> is enabled. The first storage circuit 3321 may output the stored test address TAD<1:5> as the weak cell address WCA<1:5> in response to the first to fourth sub-output signals SOUT<1:4> if the first main output signal MOUT<1> is enabled. The first storage circuit 3321 may output the weak cell information signal WCI according to a logic level of the sense signal SP in response to the first main input signal MIN<1> and the first main output signal MOUT<1> if the sub-group TAD<4:5> of the test address TAD<1:5> has a predetermined level combination. The first level combination of the main group TAD<1:3> means that the first bit TAD<1> of the test address TAD<1:5> has a logic "low(L)" level, the second bit TAD<2> of the test address TAD<1:5> has a logic "low(L)" level, and the third bit YAD<3> of the test address TAD<1:5> has a logic "low(L)" level.

The second storage circuit 3322 may store the main group TAD<1:3> having a second level combination and the sub-group TAD<4:5>, which are included in the test address TAD<1:5>, in response to the first to fourth sub-input signals SIN<1:4> if the second main input signal MIN<2> is enabled. The second storage circuit 3322 may output the stored test address TAD<1:5> as the weak cell address WCA<1:5> in response to the first to fourth sub-output signals SOUT<1:4> if the second main output signal MOUT<2> is enabled. The second storage circuit 3322 may output the weak cell information signal WCI according to a logic level of the sense signal SP in response to the second main input signal MIN<2> and the second main output signal MOUT<2> if the sub-group TAD<4:5> of the test address TAD<1:5> has a predetermined level combination. The second level combination of the main group TAD<1:3> means that the first bit TAD<1> of the test address TAD<1:5> has a logic "low(L)" level, the second bit TAD<2> of the test address TAD<1:5> has a logic "low(L)" level, and the third bit TAD<3> of the test address TAD<1:5> has a logic "high(H)" level.

The third storage circuit (not illustrated) may store the main group TAD<1:3> having a third level combination and the sub-group TAD<4:5>, which are included in the test address TAD<1:5>, in response to the first to fourth sub-input signals SIN<1:4> if the third main input signal MIN<3> is enabled. The third storage circuit may output the stored test address TAD<1:5> as the weak cell address WCA<1:5> in response to the first to fourth sub-output signals SOUT<1:4> if the third main output signal MOUT<3> is enabled. The third storage circuit may output the weak cell information signal WCI according to a logic level of the sense signal SP in response to the third main input signal MIN<3> and the third main output signal MOUT<3> if the sub-group TAD<4:5> of the test address TAD<1:5> has a predetermined level combination. The third level combination of the main group TAD<1:3> means that the first bit TAD<1> of the test address TAD<1:5> has a logic "low(L)" level, the second bit TAD<2> of the test address TAD<1:5> has a logic "high(H)" level, and the third bit TAD<3> of the test address TAD<1:5> has a logic "low(L)" level.

The fourth storage circuit (not illustrated) may store the main group TAD<1:3> having a fourth level combination and the sub-group TAD<4:5>, which are included in the test address TAD<1:5>, in response to the first to fourth sub-input signals SIN<1:4> if the fourth main input signal MIN<4> is enabled. The fourth storage circuit may output the stored test address TAD<1:5> as the weak cell address WCA<1:5> in response to the first to fourth sub-output signals SOUT<1:4> if the fourth main output signal MOUT<4> is enabled. The fourth storage circuit may output the weak cell information signal WCI according to a logic level of the sense signal SP in response to the fourth main input signal MIN<4> and the fourth main output signal MOUT<4> if the sub-group TAD<4:5> of the test address TAD<1:5> have a predetermined level combination. The fourth level combination of the main group TAD<1:3> means that the first bit TAD<1> of the test address TAD<1:5> has a logic "low(L)" level, the second bit TAD<2> of the test address TAD<1:5> has a logic "high(H)" level, and the third bit TAD<3> of the test address TAD<1:5> has a logic "high(H)" level.

The fifth storage circuit (not illustrated) may store the main group TAD<1:3> having a fifth level combination and the sub-group TAD<4:5>, which are included in the test address TAD<1:5>, in response to the first to fourth sub-input signals SIN<1:4> if the fifth main input signal MIN<5> is enabled. The fifth storage circuit may output the stored test address TAD<1:5> as the weak cell address WCA<1:5> in response to the first to fourth sub-output signals SOUT<1:4> if the fifth main output signal MOUT<5> is enabled. The fifth storage circuit may output the weak cell information signal WCI according to a logic level of the sense signal SP in response to the fifth main input signal MIN<5> and the fifth main output signal MOUT<5> if the sub-group TAD<4:5> of the test address TAD<1:5> has a predetermined level combination. The fifth level combination of the main group TAD<1:3> means that the first bit TAD<1> of the test address TAD<1:5> has a logic "high(H)" level, the second bit TAD<2> of the test address TAD<1:5> has a logic "low(L)" level, and the third bit TAD<3> of the test address TAD<1:5> has a logic "low(L)" level.

The sixth storage circuit (not illustrated) may store the main group TAD<1:3> having a sixth level combination and the sub-group TAD<4:5>, which are included in the test address TAD<1:5>, in response to the first to fourth sub-input signals SIN<1:4> if the sixth main input signal MIN<6> is enabled. The sixth storage circuit may output the stored test address TAD<1:5> as the weak cell address WCA<1:5> in response to the first to fourth sub-output signals SOUT<1:4> if the sixth main output signal MOUT<6> is enabled. The sixth storage circuit may output the weak cell information signal WCI according to a logic level of the sense signal SP in response to the sixth main input signal MIN<6> and the sixth main output signal MOUT<6> if the sub-group TAD<4:5> of the test address TAD<1:5> has a predetermined level combination. The sixth level combination of the main group TAD<1:3> means that the first bit TAD<1> of the test address TAD<1:5> has a logic "high(H)" level, the second bit TAD<2> of the test address TAD<1:5> has a logic "low(L)" level, and the third bit TAD<3> of the test address TAD<1:5> has a logic "high(H)" level.

The seventh storage circuit (not illustrated) may store the main group TAD<1:3> having a seventh level combination and the sub-group TAD<4:5>, which are included in the test address TAD<1:5>, in response to the first to fourth sub-input signals SIN<1:4> if the seventh main input signal MIN<7> is enabled. The seventh storage circuit may output the stored test address TAD<1:5> as the weak cell address WCA<1:5> in response to the first to fourth sub-output signals SOUT<1:4> if the seventh main output signal MOUT<7> is enabled. The seventh storage circuit may output the weak cell information signal WCI according to a logic level of the sense signal SP in response to the seventh main input signal MIN<7> and the seventh main output signal MOUT<7> if the sub-group TAD<4:5> of the test address TAD<1:5> has a predetermined level combination. The seventh level combination of the main group TAD<1:3> means that the first bit TAD<1> of the test address TAD<1:5> has a logic "high(H)" level, the second bit TAD<2> of the test address TAD<1:5> has a logic "high(H)" level, and the third bit TAD<3> of the test address TAD<1:5> has a logic "low(L)" level.

The eighth storage circuit 3328 may store the main group TAD<1:3> having an eighth level combination and the sub-group TAD<4:5>, which are included in the test address TAD<1:5>, in response to the first to fourth sub-input signals SIN<1:4> if the eighth main input signal MIN<8> is enabled. The eighth storage circuit 3328 may output the stored test address TAD<1:5> as the weak cell address WCA<1:5> in response to the first to fourth sub-output signals SOUT<1:4> if the eighth main output signal MOUT<8> is enabled. The eighth storage circuit 3328 may output the weak cell information signal WCI according to a logic level of the sense signal SP in response to the eighth main input signal MIN<8> and the eighth main output signal MOUT<8> if the sub-group TAD<4:5> of the test address TAD<1:5> has a predetermined level combination. The eighth level combination of the main group TAD<1:3> means that the first bit TAD<1> of the test address TAD<1:5> has a logic "high(H)" level, the second bit TAD<2> of the test address TAD<1:5> has a logic "high(H)" level, and the third bit TAD<3> of the test address TAD<1:5> has a logic "high(H)" level.

An operation of the first decoder 3311 for decoding the first to third main selection signals MSL<1:3> to generate the first to eighth main input signals MIN<1:8> will be described hereinafter with reference to FIG. 7.

The first decoder 3311 may generate the first to eighth main input signals MIN<1:8> so that only the first main input signal MIN<1> has a logic "high(H)" level if the third main selection signal MSL<3> has a logic "low(L)" level, the second main selection signal MSL<2> has a logic "low(L)" level, and the first main selection signal MSL<1> has a logic "low(L)" level.

The first decoder 3311 may generate the first to eighth main input signals MIN<1:8> so that only the second main input signal MIN<2> has a logic "high(H)" level if the third main selection signal MSL<3> has a logic "low(L)" level, the second main selection signal MSL<2> has a logic "low(L)" level, and the first main selection signal MSL<1> has a logic "high(H)" level.

The first decoder 3311 may generate the first to eighth main input signals MIN<1:8> so that only the third main input signal MIN<3> has a logic "high(H)" level if the third main selection signal MSL<3> has a logic "low(L)" level, the second main selection signal MSL<2> has a logic "high(H)" level, and the first main selection signal MSL<1> has a logic "low(L)" level.

The first decoder 3311 may generate the first to eighth main input signals MIN<1:8> so that only the fourth main input signal MIN<4> has a logic "high(H)" level if the third main selection signal MSL<3> has a logic "low(L)" level, the second main selection signal MSL<2> has a logic "high(H)" level, and the first main selection signal MSL<1> has a logic "high(H)" level.

The first decoder 3311 may generate the first to eighth main input signals MIN<1:8> so that only the fifth main input signal MIN<5> has a logic "high(H)" level if the third main selection signal MSL<3> has a logic "high(H)" level, the second main selection signal MSL<2> has a logic "low(L)" level, and the first main selection signal MSL<1> has a logic "low(L)" level.

The first decoder 3311 may generate the first to eighth main input signals MIN<1:8> so that only the sixth main input signal MIN<6> has a logic "high(H)" level if the third main selection signal MSL<3> has a logic "high(H)" level, the second main selection signal MSL<2> has a logic "low(L)" level, and the first main selection signal MSL<1> has a logic "high(H)" level.

The first decoder 3311 may generate the first to eighth main input signals MIN<1:8> so that only the seventh main input signal MIN<7> has a logic "high(H)" level if the third main selection signal MSL<3> has a logic "high(H)" level, the second main selection signal MSL<2> has a logic "high(H)" level, and the first main selection signal MSL<1> has a logic "low(L)" level.

The first decoder 3311 may generate the first to eighth main input signals MIN<1:8> so that only the eighth main input signal MIN<8> has a logic "high(H)" level if the third main selection signal MSL<3> has a logic "high(H)" level, the second main selection signal MSL<2> has a logic "high(H)" level, and the first main selection signal MSL<1> has a logic "high(H)" level.

An operation of the first decoder 3311 for decoding the first and second sub-selection signals SSL<1:2> to generate the first to fourth sub-input signals SIN<1:4> will be described hereinafter with reference to FIG. 8.

The first decoder 3311 may generate the first to fourth sub-input signals SIN<1:4> so that only the first sub-input signal SIN<1> has a logic "high(H)" level if the second sub-selection signal SSL<2> has a logic "low(L)" level and the first sub-selection signal SSL<1> has a logic "low(L)" level.

The first decoder 3311 may generate the first to fourth sub-input signals SIN<1:4> so that only the second sub-input signal SIN<2> has a logic "high(H)" level if the second sub-selection signal SSL<2> has a logic "low(L)" level and the first sub-selection signal SSL<1> has a logic "high(H)" level.

The first decoder 3311 may generate the first to fourth sub-input signals SIN<1:4> so that only the third sub-input signal SIN<3> has a logic "high(H)" level if the second sub-selection signal SSL<2> has a logic "high(H)" level and the first sub-selection signal SSL<1> has a logic "low(L)" level.

The first decoder 3311 may generate the first to fourth sub-input signals SIN<1:4> so that only the fourth sub-input signal SIN<4> has a logic "high(H)" level if the second sub-selection signal SSL<2> has a logic "high(H)" level and the first sub-selection signal SSL<1> has a logic "high(H)" level.

An operation of the second decoder 3312 for decoding the fourth to sixth main selection signals MSL<4:6> to generate the first to eighth main output signals MOUT<1:8> will be described hereinafter with reference to FIG. 9.

The second decoder 3312 may generate the first to eighth main output signals MOUT<1:8> so that only the first main output signal MOUT<1> has a logic "high(H)" level if the sixth main selection signal MSL<6> has a logic "low(L)" level, the fifth main selection signal MSL<5> has a logic "low(L)" level, and the fourth main selection signal MSL<4> has a logic "low(L)" level.

The second decoder 3312 may generate the first to eighth main output signals MOUT<1:8> so that only the second main output signal MOUT<2> has a logic "high(H)" level if the sixth main selection signal MSL<6> has a logic "low (L)" level, the fifth main selection signal MSL<5> has a logic "low(L)" level, and the fourth main selection signal MSL<4> has a logic "high(H)" level.

The second decoder 3312 may generate the first to eighth main output signals MOUT<1:8> so that only the third main output signal MOUT<3> has a logic "high(H)" level if the sixth main selection signal MSL<6> has a logic "low(L)" level, the fifth main selection signal MSL<5> has a logic "high(H)" level, and the fourth main selection signal MSL<4> has a logic "low(L)" level.

The second decoder 3312 may generate the first to eighth main output signals MOUT<1:8> so that only the fourth main output signal MOUT<4> has a logic "high(H)" level if the sixth main selection signal MSL<6> has a logic "low (L)" level, the fifth main selection signal MSL<5> has a logic "high(H)" level, and the fourth main selection signal MSL<4> has a logic "high(H)" level.

The second decoder 3312 may generate the first to eighth main output signals MOUT<1:8> so that only the fifth main output signal MOUT<5> has a logic "high(H)" level if the sixth main selection signal MSL<6> has a logic "high(H)" level, the fifth main selection signal MSL<5> has a logic "low(L)" level, and the fourth main selection signal MSL<4> has a logic "low(L)" level.

The second decoder 3312 may generate the first to eighth main output signals MOUT<1:8> so that only the sixth main output signal MOUT<6> has a logic "high(H)" level if the sixth main selection signal MSL<6> has a logic "high(H)"

level, the fifth main selection signal MSL<5> has a logic "low(L)" level, and the fourth main selection signal MSL<4> has a logic "high(H)" level.

The second decoder 3312 may generate the first to eighth main output signals MOUT<1:8> so that only the seventh main output signal MOUT<7> has a logic "high(H)" level if the sixth main selection signal MSL<6> has a logic "high (H)" level, the fifth main selection signal MSL<5> has a logic "high(H)" level, and the fourth main selection signal MSL<4> has a logic "low(L)" level.

The second decoder 3312 may generate the first to eighth main output signals MOUT<1:8> so that only the eighth main output signal MOUT<8> has a logic "high(H)" level if the sixth main selection signal MSL<6> has a logic "high (H)" level, the fifth main selection signal MSL<5> has a logic "high(H)" level, and the fourth main selection signal MSL<4> has a logic "high(H)" level.

An operation of the second decoder 3312 for decoding the third and fourth sub-selection signals SSL<3:4> to generate the first to fourth sub-output signals SOUT<1:4> will be described hereinafter with reference to FIG. 10.

The second decoder 3312 may generate the first to fourth sub-output signals SOUT<1:4> so that only the first sub-output signal SOUT<1> has a logic "high(H)" level if the fourth sub-selection signal SSL<4> has a logic "low(L)" level and the third sub-selection signal SSL<3> has a logic "low(L)" level.

The second decoder 3312 may generate the first to fourth sub-output signals SOUT<1:4> so that only the second sub-output signal SOUT<2> has a logic "high(H)" level if the fourth sub-selection signal SSL<4> has a logic "low(L)" level and the third sub-selection signal SSL<3> has a logic "high(H)" level.

The second decoder 3312 may generate the first to fourth sub-output signals SOUT<1:4> so that only the third sub-output signal SOUT<3> has a logic "high(H)" level if the fourth sub-selection signal SSL<4> has a logic "high(H)" level and the third sub-selection signal SSL<3> has a logic "low(L)" level.

The second decoder 3312 may generate the first to fourth sub-output signals SOUT<1:4> so that only the fourth sub-output signal SOUT<4> has a logic "high(H)" level if the fourth sub-selection signal SSL<4> has a logic "high (H)" level and the third sub-selection signal SSL<3> has a logic "high(H)" level.

Figure 11:
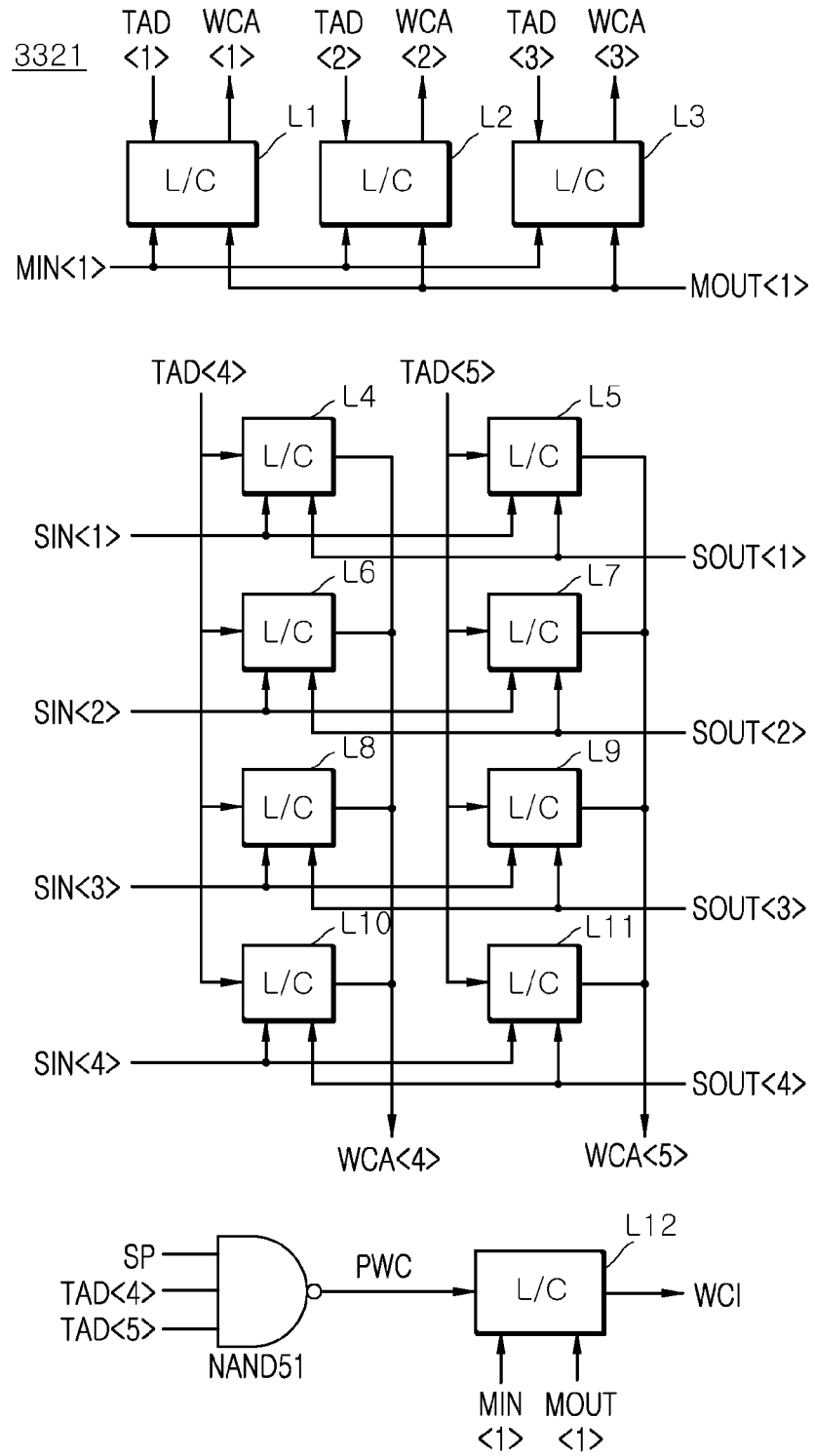
FIG. 11 illustrates a configuration of a first storage circuit included in the weak cell address storage circuit of FIG. 6.

Referring to FIG. 11, the first storage circuit 3321 may include, for example but not limited to, a plurality of latches L1~L12 and a NAND gate NAND51.

The latches L1, L2, and L3 may respectively store data of the main group TAD<1:3>, which is included in the test address TAD<1:5> to have a first level combination, if the first main input signal MIN<1> is enabled to have a logic "high(H)" level. The latches L1, L2, and L3 may output the stored data of the main group TAD<1:3> having the first level combination as the first to third bits WCA<1:3> of the weak cell address WCA<1:5> if the first main output signal MOUT<1> is enabled to have a logic "high(H)" level.

The latches L1, L2, and L3 may be realized using latch circuits for storing the data of the main group TAD<1:3> having the first level combination. The number of the latches L1, L2, and L3 may be set to be equal to the number of bits included in the main group TAD<1:3>.

The latches L4 and L5 may respectively store data of the sub-group TAD<4:5>, which is included in the test address TAD<1:5>, if the first sub-input signal SIN<1> is enabled to have a logic "high(H)" level. The latches L4 and L5 may output the stored data of the sub-group TAD<4:5> as the fourth and fifth bits WCA<4:5> if the first sub-output signal SOUT<1> is enabled to have a logic "high(H)" level.

The latches L6 and L7 may respectively store data of the sub-group TAD<4:5>, which is included in the test address TAD<1:5>, if the second sub-input signal SIN<2> is enabled to have a logic "high(H)" level. The latches L6 and L7 may output the stored data of the sub-group TAD<4:5> as the fourth and fifth bits WCA<4:5> if the second sub-output signal SOUT<2> is enabled to have a logic "high(H)" level.

The latches L8 and L9 may respectively store data of the sub-group TAD<4:5>, which is included in the test address TAD<1:5>, if the third sub-input signal SIN<3> is enabled to have a logic "high(H)" level. The latches L8 and L9 may output the stored data of the sub-group TAD<4:5> as the fourth and fifth bits WCA<4:5> if the third sub-output signal SOUT<3> is enabled to have a logic "high(H)" level.

The latches L10 and L11 may respectively store data of the sub-group TAD<4:5>, which is included in the test address TAD<1:5>, if the fourth sub-input signal SIN<4> is enabled to have a logic "high(H)" level. The latches L10 and L11 may output the stored data of the sub-group TAD<4:5> as the fourth and fifth bits WCA<4:5> if the fourth sub-output signal SOUT<4> is enabled to have a logic "high(H)" level.

The latches L4~L11 may be realized using latch circuits for storing the data of the sub-group TAD<4:5>. The number of the latches L4~L11 may be determined such that the latches L4~L11 are able to store all of data of the sub-group TAD<4:5> that is counted.

The NAND gate NAND51 may generate a pre-weak cell information signal PWC which is enabled in response to the sense signal SP if the sub-group TAD<4:5> of the test address TAD<1:5> has a predetermined level combination. The NAND gate NAND51 may generate the pre-weak cell information signal PWC having a logic "low(L)" level if both of bits included in the sub-group TAD<4:5> have a logic "high(H)" level and the sense signal SP has a logic "high(H)" level. The NAND gate NAND51 may generate the pre-weak cell information signal PWC having a logic "high(H)" level if both of bits included in the sub-group TAD<4:5> have a logic "high(H)" level and the sense signal SP has a logic "low(L)" level.

The latch L12 may store the pre-weak cell information signal PWC if the first main input signal MIN<l> is enabled to have a logic "high(H)" level. The latch L12 may output the stored pre-weak cell information signal PWC as the weak cell information signal WCI if the first main output signal MOUT<1> is enabled to have a logic "high(H)" level. In the event that the weak cell information signal WCI has a logic "high(H)" level, the memory cells MC connected to a word line selected by the test address TAD<1:5> may be regarded as normal cells that are not the weak cells. In the event that the weak cell information signal WCI has a logic "low(L)" level, the memory cells MC connected to a word line selected by the test address TAD<1:5> may be regarded as the weak cells.

In the first storage circuit 3321, only three latches are required to store the data of the main group TAD<1:3> having the first level combination. Thus, the number of the latches may be reduced. For example, if the test address TAD<1:5> is counted to have a level combination of '11101' and a level combination of '11110', a general storage circuit may include ten latches to store the first test address TAD<1:5> having a level combination of '11101' and the second test address TAD<1:5> having a level combination of '11110'. However, according to an embodiment, the main groups TAD<1:3> of the first and second test addresses TAD<1:5> have a level combination of '111' in common. Thus, only three latches (i.e., the latches L1, L2, and L3) may be required to store the main groups TAD<1:3> of the first and second test addresses TAD<1:5>, and four latches (e.g., the latches L4~L7) may be required to store the sub groups TAD<4:5> having a level combination of '01' and the sub groups TAD<4:5> having a level combination of '10'. That is, if the number of level combinations of the test address TAD<1:5> is two, the first storage circuit 3321 may be realized using only three latches to store the main groups TAD<1:3> while a general storage circuit is realized using six latches to store the main groups TAD<1:3>. As a result, according to an embodiment, the number of the latches may be reduced.

In addition, the number of the latches included in the first storage circuit 3321 may increase as the number of the weak cells increases. However, according to an embodiment, the first storage circuit 3321 may be designed to store various main groups having the same level combination into the minimum number of latches. Thus, the number of the latches may be reduced.

Each of the second to eighth storage circuits 3322~3328 may be designed to have substantially the same configuration as the first storage circuit 3321 except the I/O signals. Thus, descriptions of the second to eighth storage circuits 3322~3328 will be omitted hereinafter.

Figure 12:
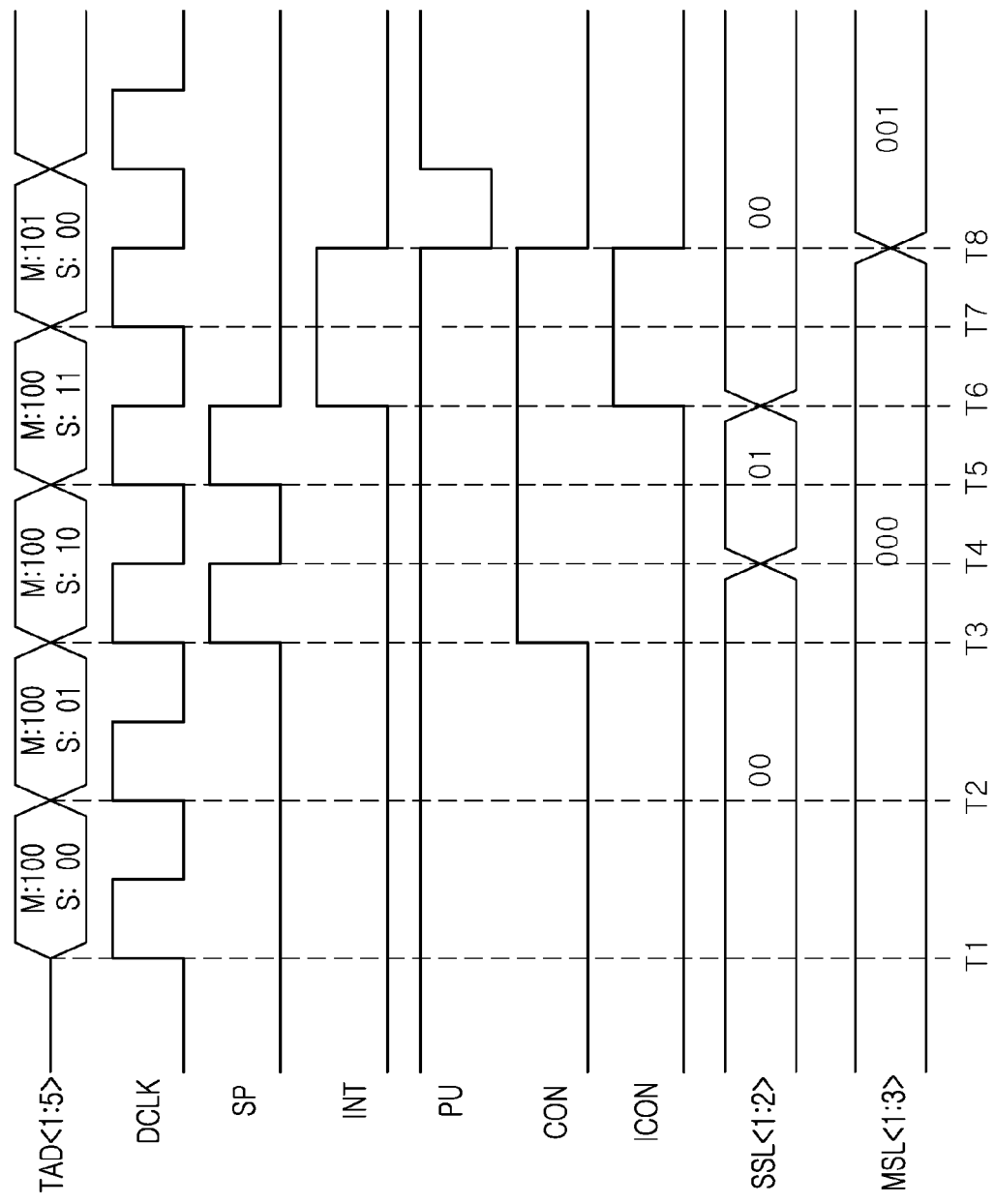
FIGS. 12 and 13 are timing diagrams illustrating operations of the semiconductor device according to an embodiment of the present disclosure.

An operation of the semiconductor device having an aforementioned configuration will be described hereinafter. For example, an operation for storing weak cell addresses will be described hereinafter with reference to FIG. 12.

At a point of time "T1", the test address generation circuit 11 may generate the test address TAD<1:5> that is counted in response to the refresh signal REF and the detection clock signal DCLK. In such a case, a main group M (corresponding to the first to third bits TAD<1:3>) of the test address TAD<1:5> may be generated to have a level combination of '100', and a sub-group S (corresponding to the fourth and fifth bits TAD<4:5>) of the test address TAD<1:5> may be generated to have a level combination of '00'. In the main group M, a level combination of '100' means that the first bit TAD<1> of the test address TAD<1:5> has a logic "high (H)" level, the second bit TAD<2> of the test address TAD<1:5> has a logic "low(L)" level, and the third bit TAD<3> of the test address TAD<1:5> has a logic "low(L)" level. In the sub-group S, a level combination of '00' means that the fourth bit TAD<4> has a logic "low(L)" level and the fifth bit TAD<5> has a logic "low(L)" level.

The first decoder 3311 of the weak cell address storage circuit 33 may decode the first to third main selection signals MSL<1:3> having a level combination of '000' and the first and second sub-selection signals SSL<1:2> having a level combination of '00' to generate the first main input signal MIN<1> having a logic "high(H)" level and a first sub-input signal SIN<1> having a logic "high(H)" level. In the first to third main selection signals MSL<1:3>, a level combination of '000' means that the third main selection signal MSL<3> has a logic "low(L)" level, the second main selection signal MSL<2> has a logic "low(L)" level, and the first main selection signal MSL<1> has a logic "low(L)" level. In the first and second sub-selection signals SSL<1:2>, a level combination of '00' means that the second sub-selection signal SSL<2> has a logic "low(L)" level and the first sub-selection signal SSL<1> has a logic "low(L)" level.

At a point of time "T2", the test address generation circuit 11 may generate the test address TAD<1:5> that are counted in response to the refresh signal REF and the detection clock signal DCLK. In such a case, the main group M of the test address TAD<1:5> may be generated to have a level combination of '100', and the sub-group S of the test address TAD<1:5> may be generated to have a level combination of '01'. In the sub-group S, a level combination of '01' means that the fourth bit TAD<4> has a logic "low(L)" level and the fifth bit TAD<5> has a logic "high(H)" level.

At a point of time "T3", the test address generation circuit 11 may generate the test address TAD<1:5> that is counted in response to the refresh signal REF and the detection clock signal DCLK. In such a case, the main group M of the test address TAD<1:5> may be generated to have a level combination of '100', and the sub-group S of the test address TAD<1:5> may be generated to have a level combination of '10'. In the sub-group S, a level combination of '10' means that the fourth bit TAD<4> has a logic "high(H)" level and the fifth bit TAD<5> has a logic "low(L)" level.

The memory circuit 20 may output the internal data ID since the nineteenth word line WL19 is selected and activated by the test address TAD<1:5>. In such a case, the internal data ID may be generated to have a logic "low(L)" level. Thus, the memory cells MC connected to the nineteenth word line WL19 may be regarded as the weak cells. A level combination of the test address TAD<1:5> may correspond to a level combination for selecting the nineteenth word line WL19.

The sensing circuit 12 may sense a logic "low(L)" level of the internal data ID to generate the sense signal SP including a pulse having a logic "high(H)" level.

The control signal generation circuit 311 of the input control circuit 31 may generate the control signal CON having a logic "high(H)" level in response to the sense signal SP.

The latches L1, L2 and L3 of the first storage circuit 3321 may store the first to third bits TAD<1:3> corresponding to the main group M of the test address TAD<1:5> in response to the first main input signal MIN<1> having a logic "high(H)" level. The latches L4 and L5 of the first storage circuit 3321 may store the fourth and fifth bits TAD<4:5> corresponding to the sub-group S of the test address TAD<1: 5> in response to the first sub-input signal SIN<1> having a logic "high(H)" level.

At a point of time "T4", the first sub-selection signal generation circuit 313 may generate the first sub-selection signal SSL<1> in response to the sense signal SP, a level of which changes from a logic "high(H)" level into a logic "low(L)" level.

The first decoder 3311 of the weak cell address storage circuit 33 may decode the first to third main selection signals MSL<1:3> having a level combination of '000' and the first and second sub-selection signals SSL<1:2> having a level combination of '01' to generate the first main input signal MIN<1> having a logic "high(H)" level and a second sub-input signal SIN<2> having a logic "high(H)" level. In the first and second sub-selection signals SSL<1:2>, a level combination of '01' means that the second sub-selection signal SSL<2> has a logic "low(L)" level and the first sub-selection signal SSL<1> has a logic "high(H)" level.

At a point of time "T5", the test address generation circuit 11 may generate the test address TAD<1:5> that is counted in response to the refresh signal REF and the detection clock signal DCLK. In such a case, the main group M of the test address TAD<1:5> may be generated to have a level combination of '100', and the sub-group S of the test address TAD<1:5> may be generated to have a level combination of '11'. In the sub-group S, a level combination of '11' means that the fourth bit TAD<4> has a logic "high(H)" level and the fifth bit TAD<5> has a logic "high(H)" level.

The memory circuit 20 may output the internal data ID since the twentieth word line WL20 is selected and activated by the test address TAD<1:5>. In such a case, the internal data ID may be generated to have a logic "low(L)" level. Thus, the memory cells MC connected to the twentieth word line WL20 may be regarded as the weak cells. A level combination of the test address TAD<1:5> may correspond to a level combination for selecting the twentieth word line WL20.

The sensing circuit 12 may sense a logic "low(L)" level of the internal data ID to generate the sense signal SP including a pulse having a logic "high(H)" level.

The control signal generation circuit 311 of the input control circuit 31 may generate the control signal CON having a logic "high(H)" level in response to the sense signal SP.

The latches L6 and L7 of the first storage circuit 3321 may store the fourth and fifth bits TAD<4:5> corresponding to the sub-group S of the test address TAD<1:5> in response to the second sub-input signal SIN<2> having a logic "high(H)" level.

The NAND gate NAND51 may generate the pre-weak cell information signal PWC having a logic "low(L)" level in response to the sense signal SP because the sub-group TAD<4:5> of the test address TAD<1:5> has a predetermined level combination.

The latches L12 may store the pre-weak cell information signal PWC in response to the first main input signal MIN<1> having a logic "high(H)" level. The pre-weak cell information signal PWC having a logic "low(L)" level means that the memory cells MC selected by the test address TAD<1:5> correspond to the weak cells.

At a point of time "T6", the initialization signal generation circuit 3111 may generate the initialization signal INT which is enabled to have a logic "high(H)" level in response to the detection clock signal DCLK because the fourth and fifth bits TAD<4:5> have a predetermined level combination.

The AND gate AND31 of the first main selection signal generation circuit 312 may perform an AND operation of the initialization signal INT and the control signal CON to generate the internal control signal ICON having a logic "high(H)" level.

The first sub-selection signal generation circuit 313 may initialize the first and second sub-selection signals SSL<1:2> in response to the initialization signal INT having a logic "high(H)" level. The first and second sub-selection signals SSL<1:2> may be initialized to have a level combination of '00'.

At a point of time "T7", the test address generation circuit 11 may generate the test address TAD<1:5> that is counted in response to the refresh signal REF and the detection clock signal DCLK. In such a case, the main group M of the test address TAD<1:5> may be generated to have a level combination of '101', and the sub-group S of the test address TAD<1:5> may be generated to have a level combination of '00'. In the main group M, a level combination of '101' means that the first bit TAD<1> of the test address TAD<1:5> has a logic "high(H)" level, the second bit TAD<2> of the test address TAD<1:5> has a logic "low(L)" level, and the third bit TAD<3> of the test address TAD<1:5> has a logic "high(H)" level. In the sub-group S, a level combination of '00' means that the fourth bit TAD<4> has a logic "low(L)" level and the fifth bit TAD<5> has a logic "low(L)" level.

At a point of time "T8", the initialization signal generation circuit 3111 may generate the initialization signal INT having a logic "low(L)" level in response to the detection clock signal DCLK because the fourth and fifth bits TAD<4:5> do not have a predetermined level combination.

The pull-up signal generation circuit 3112 may generate the pull-up signal PU including a pulse having a logic "low(L)" level during a predetermined period if a level of the initialization signal INT changes from a logic "high(H)" level into a logic "low(L)" level.

The driving circuit 3113 may generate the control signal CON which is disabled to have a logic "low(L)" level in response to the pull-up signal PU.

The AND gate AND31 of the first main selection signal generation circuit 312 may perform an AND operation of the initialization signal INT and the control signal CON to generate the internal control signal ICON having a logic "low(L)" level.

The first main selection signal generation circuit 312 may generate the first main selection signal MSL<1> having a logic "high(H)" level in response to the internal control signal ICON, a level of which changes from a logic "high (H)" level into a logic "low(L)" level.

The first decoder 3311 of the weak cell address storage circuit 33 may decode the first to third main selection signals MSL<1:3> having a level combination of '001' and the first and second sub-selection signals SSL<1:2> having a level combination of '00' to generate the first main input signal MIN<1> having a logic "high(H)" level and a first sub-input signal SIN<1> having a logic "high(H)" level. In the first to third main selection signals MSL<1:3>, a level combination of '001' means that the third main selection signal MSL<3> has a logic "low(L)" level, the second main selection signal MSL<2> has a logic "low(L)" level, and the first main selection signal MSL<1> has a logic "high(H)" level. In the first and second sub-selection signals SSL<1:2>, a level combination of '00' means that the second sub-selection signal SSL<2> has a logic "low(L)" level and the first sub-selection signal SSL<1> has a logic "low(L)" level.

Subsequently, the second storage circuit 3322 may store the main group TAD<1:3> having a second level combination and the sub-group TAD<4:5>, which are included in the test address TAD<1:5>, according to the first to fourth sub-input signals SIN<1:4> in response to the second main input signal MIN<2> having a logic "high(H)" level.

As described above, a semiconductor device according to an embodiment may divide each of test addresses, which have different level combinations and include position information on weak cells, into a main group and a sub-group and may store the main groups and the sub-groups. In such a case, the semiconductor device may store the sub-groups depending from the main groups having the same level combination into one of storage circuits to compress the test addresses. As a result, the semiconductor device may be realized to have a compact size.

Figure 13:
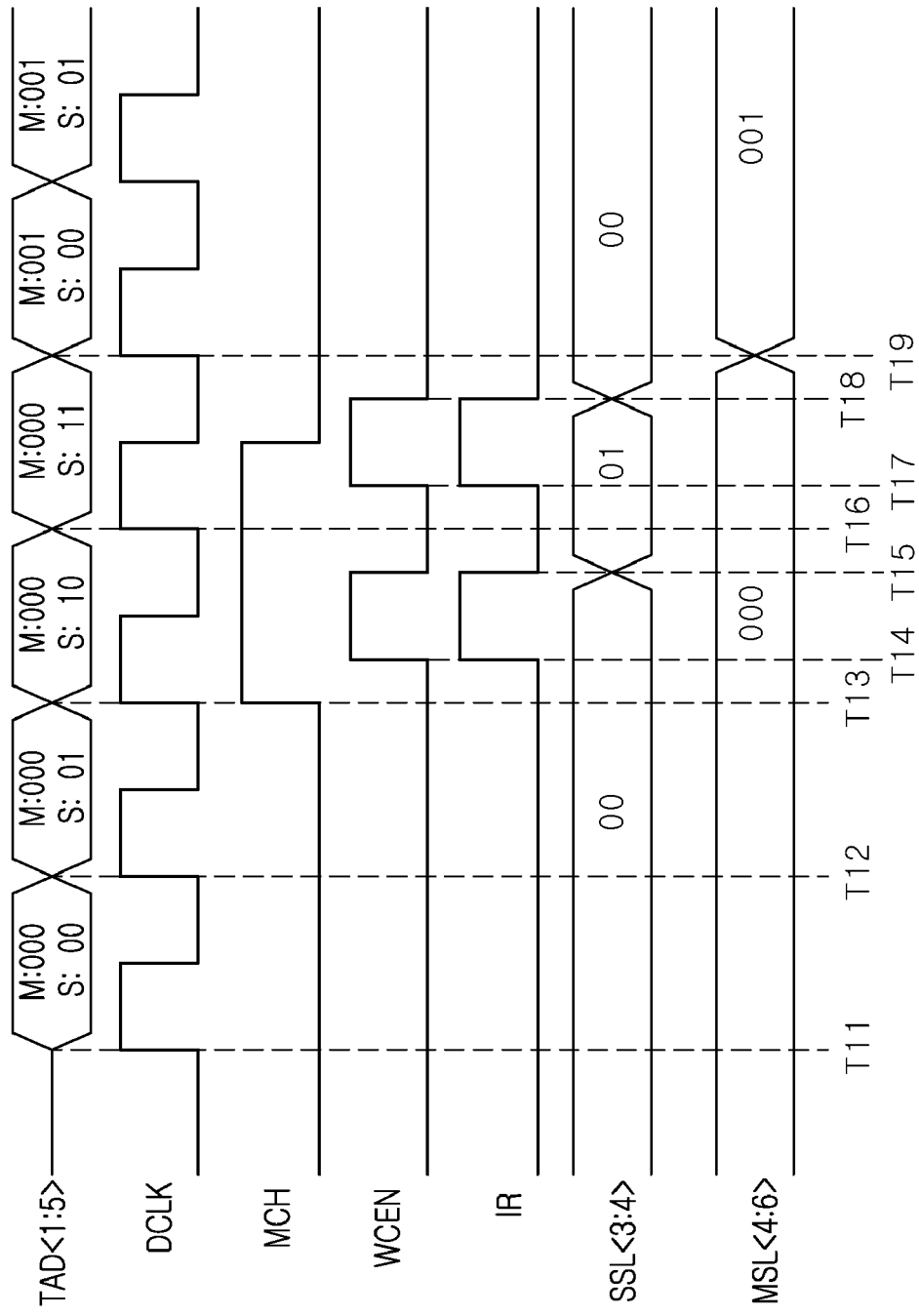

Another operation of the semiconductor device will be described hereinafter. For example, a refresh operation of the semiconductor device using weak cell addresses will be described hereinafter with reference to FIG. 13.

At a point of time "T11", the test address generation circuit 11 may generate the test address TAD<1:5> that is counted in response to the refresh signal REF and the detection clock signal DCLK. In such a case, a main group M (corresponding to the first to third bits TAD<1:3>) of the test address TAD<1:5> may be generated to have a level combination of '000', and a sub-group S (corresponding to the fourth and fifth bits TAD<4:5>) of the test address TAD<1:5> may be generated to have a level combination of '00'. In the main group M, a level combination of '000' means that the first bit TAD<1> of the test address TAD<1:5> has a logic "low(L)" level, the second bit TAD<2> of the test address TAD<1:5> has a logic "low(L)" level, and the third bit TAD<3> of the test address TAD<1:5> has a logic "low(L)" level. In the sub-group S, a level combination of '00' means that the fourth bit TAD<4> has a logic "low(L)" level and the fifth bit TAD<5> has a logic "low(L)" level.

The second decoder 3312 of the weak cell address storage circuit 33 may decode the fourth to sixth main selection signals MSL<4:6> having a level combination of '000' and the third and fourth sub-selection signals SSL<3:4> having a level combination of '00' to generate the first main output signal MOUT<1> having a logic "high(H)" level and the first sub-output signal SOUT<1> having a logic "high(H)" level. In the fourth to sixth main selection signals MSL<4:6>, a level combination of '000' means that the sixth main selection signal MSL<6> has a logic "low(L)" level, the fifth main selection signal MSL<5> has a logic "low(L)" level, and the fourth main selection signal MSL<4> has a logic "low(L)" level. In the third and fourth sub-selection signals SSL<3:4>, a level combination of '00' means that the fourth sub-selection signal SSL<4> has a logic "low(L)" level and the third sub-selection signal SSL<3> has a logic "low(L)" level.

The latches L1, L2, and L3 of the first storage circuit 3321 may output the first to third bits TAD<1:3> corresponding to the main group M of the test address TAD<1:5> stored therein as the first to third bits WCA<1:3> corresponding to a main group of the weak cell address WCA<1:5> in response to the first main output signal MOUT<1> having a logic "high(H)" level. The latches L4 and L5 of the first storage circuit 3321 may output the stored sub-group TAD<4:5> of the test address TAD<1:5> as the fourth and fifth bits WCA<4:5> corresponding to a sub-group of the weak cell address WCA<1:5> in response to the first sub-output signal SOUT<1> having a logic "high(H)" level.

At a point of time "T12", the test address generation circuit 11 may generate the test address TAD<1:5> that is counted in response to the refresh signal REF and the detection clock signal DCLK. In such a case, the main group M of the test address TAD<1:5> may be generated to have a level combination of '000', and the sub-group S of the test address TAD<1:5> may be generated to have a level combination of '01'. In the sub-group S, a level combination of '01' means that the fourth bit TAD<4> has a logic "low(L)" level and the fifth bit TAD<5> has a logic "high(H)" level.

At a point of time "T13", the test address generation circuit 11 may generate the test address TAD<1:5> that is counted in response to the refresh signal REF and the detection clock signal DCLK. In such a case, the main group M of the test address TAD<1:5> may be generated to have a level combination of '000', and the sub-group S of the test address TAD<1:5> may be generated to have a level combination of '10'. In the sub-group S, a level combination of '10' means that the fourth bit TAD<4> has a logic "high(H)" level and the fifth bit TAD<5> has a logic "low(L)" level.

The comparison signal generation circuit 3211 of the internal refresh signal generation circuit 321 may generate the comparison signal CMP which is enabled to have a logic "low(L)" level since a complementary signal of the first bit TAD<1> of the test address TAD<1:5> has the same logic level as the first bit WCA<1> of the weak cell address WCA<1:5>, the second bit TAD<2> of the test address TAD<1:5> has the same logic level as the second bit WCA<2> of the weak cell address WCA<1:5>, and the third bit TAD<3> of the test address TAD<1:5> has the same logic level as the third bit WCA<3> of the weak cell address WCA<1:5>.

The match signal generation circuit 3212 may generate the match signal MCH which is enabled to have a logic "high(H)" level in response to the comparison signal CMP having a logic "low(L)" level.

At a point of time "T14", the logic circuit 3213 may perform an AND operation of the match signal MCH and the enablement signal WCEN to generate the internal refresh signal IR having a logic "high(H)" level.

The memory circuit 20 may activate the nineteenth word line WL19 selected by the weak cell address WCA<1:5> in response to the internal refresh signal IR having a logic "high(H)" level. That is, memory circuit 20 may activate the nineteenth word line WL19 to perform an additional refresh operation of the weak cells.

At a point of time "T15", the logic circuit 3213 may perform an AND operation of the match signal MCH and the enablement signal WCEN to generate the internal refresh signal IR, a level of which changes from a logic "high(H)" level into a logic "low(L)" level.

The second sub-selection signal generation circuit 324 may generate the third sub-selection signal SSL<3> having a logic "high(H)" level in response to the internal refresh signal IR, a level of which changes from a logic "high(H)" level into a logic "low(L)" level.

The second decoder 3312 of the weak cell address storage circuit 33 may decode the fourth to sixth main selection signals MSL<4:6> having a level combination of '000' and the third and fourth sub-selection signals SSL<3:4> having a level combination of '01' to generate the first main output signal MOUT<1> having a logic "high(H)" level and the second sub-output signal SOUT<2> having a logic "high (H)" level. In the third and fourth sub-selection signals SSL<3:4>, a level combination of '01' means that the fourth sub-selection signal SSL<4> has a logic "low(L)" level and the third sub-selection signal SSL<3> has a logic "high(H)" level.

The latches L1, L2, and L3 of the first storage circuit 3321 may output the first to third bits TAD<1:3> corresponding to the main group M of the test address TAD<1:5> stored therein as the first to third bits WCA<1:3> corresponding to the main group of the weak cell address WCA<1:5> in response to the first main output signal MOUT<1> having a logic "high(H)" level. The latches L4 and L5 of the first storage circuit 3321 may output the stored sub-group TAD<4:5> of the test address TAD<1:5> as the fourth and fifth bits WCA<4:5> corresponding to the sub-group of the weak cell address WCA<1:5> in response to the second sub-output signal SOUT<2> having a logic "high(H)" level.

At a point of time "T16", the test address generation circuit 11 may generate the test address TAD<1:5> that are counted in response to the refresh signal REF and the detection clock signal DCLK. In such a case, the main group M of the test address TAD<1:5> may be generated to have a level combination of '000', and the sub-group S of the test address TAD<1:5> may be generated to have a level combination of '11'. In the sub-group S, a level combination of '11' means that the fourth bit TAD<4> has a logic "high(H)" level and the fifth bit TAD<5> has a logic "high(H)" level.

The comparison signal generation circuit 3211 of the internal refresh signal generation circuit 321 may generate the comparison signal CMP which is enabled to have a logic "low(L)" level since a complementary signal of the first bit TAD<1> of the test address TAD<1:5> has the same logic level as the first bit WCA<1> of the weak cell address WCA<1:5>, the second bit TAD<2> of the test address TAD<1:5> has the same logic level as the second bit WCA<2> of the weak cell address WCA<1:5>, and the third bit TAD<3> of the test address TAD<1:5> has the same logic level as the third bit WCA<3> of the weak cell address WCA<1:5>.

The match signal generation circuit 3212 may generate the match signal MCH which is enabled to have a logic "high(H)" level in response to the comparison signal CMP having a logic "low(L)" level.

At a point of time "T17", the logic circuit 3213 may perform an AND operation of the match signal MCH and the enablement signal WCEN to generate the internal refresh signal IR having a logic "high(H)" level.

The memory circuit 20 may activate the twentieth word line WL20 selected by the weak cell address WCA<1:5> in response to the internal refresh signal IR having a logic "high(H)" level. That is, memory circuit 20 may activate the twentieth word line WL20 to perform an additional refresh operation of the weak cells.

At a point of time "T18", the logic circuit 3213 may perform an AND operation of the match signal MCH and the enablement signal WCEN to generate the internal refresh signal IR, a level of which changes from a logic "high(H)" level into a logic "low(L)" level.

The reset signal generation circuit 322 may generate the reset signal RST which is enabled to have a logic "high(H)" level in response to the internal refresh signal IR since the sub-group TAD<4:5> of the test address TAD<1:5> has a predetermined level combination.

The second sub-selection signal generation circuit 324 may generate the third and fourth sub-selection signals SSL<3:4> which are initialized in response to the reset signal RST having a logic "high(H)" level.

At a point of time "T19", the comparison signal generation circuit 3211 of the internal refresh signal generation circuit 321 may generate the comparison signal CMP which is disabled to have a logic "high(H)" level since a complementary signal of the first bit TAD<1> of the test address TAD<1:5> has the same logic level as the first bit WCA<1> of the weak cell address WCA<1:5>, the second bit TAD<2> of the test address TAD<1:5> has the same logic level as the second bit WCA<2> of the weak cell address WCA<1:5>, and the third bit TAD<3> of the test address TAD<1:5> has a different logic level from the third bit WCA<3> of the weak cell address WCA<1:5>.

The match signal generation circuit 3212 may generate the match signal MCH which is disabled to have a logic "low(L)" level in response to the comparison signal CMP having a logic "high(H)" level and the reset signal RST having a logic "high(H)" level.

The first sub-selection signal generation circuit 323 may generate the fourth main selection signal MSL<4> having a logic "high(H)" level in response to the match signal MCH, a level of which changes from a logic "high(H)" level into a logic "low(L)" level.

The second decoder 3312 of the weak cell address storage circuit 33 may decode the fourth to sixth main selection signals MSL<4:6> having a level combination of '001' and the third and fourth sub-selection signals SSL<3:4> having a level combination of '00' to generate the second main output signal MOUT<2> having a logic "high(H)" level and the first sub-output signal SOUT<1> having a logic "high (H)" level. In the fourth to sixth main selection signals MSL<4:6>, a level combination of '001' means that the sixth main selection signal MSL<6> has a logic "low(L)" level, the fifth main selection signal MSL<5> has a logic "low(L)" level, and the fourth main selection signal MSL<4> has a logic "high(H)" level. In the third and fourth sub-selection signals SSL<3:4>, a level combination of '00' means that the fourth sub-selection signal SSL<4> has a logic "low(L)" level and the third sub-selection signal SSL<3> has a logic "low(L)" level.

Subsequently, the second storage circuit 3322 may output the test address TAD<1:5>, which is stored in the second storage circuit 3322, as the weak cell address WCA<1:5> according to the first to fourth sub-output signals SOUT<1: 4> in response to the second main output signal MOUT<2> having a logic "high(H)" level.

As described above, a semiconductor device according to an embodiment may perform an additional refresh operation regarding test addresses of weak cells, which are stored during a normal refresh operation. Thus, the reliability of internal data stored in the weak cells may be improved.

Figure 14:
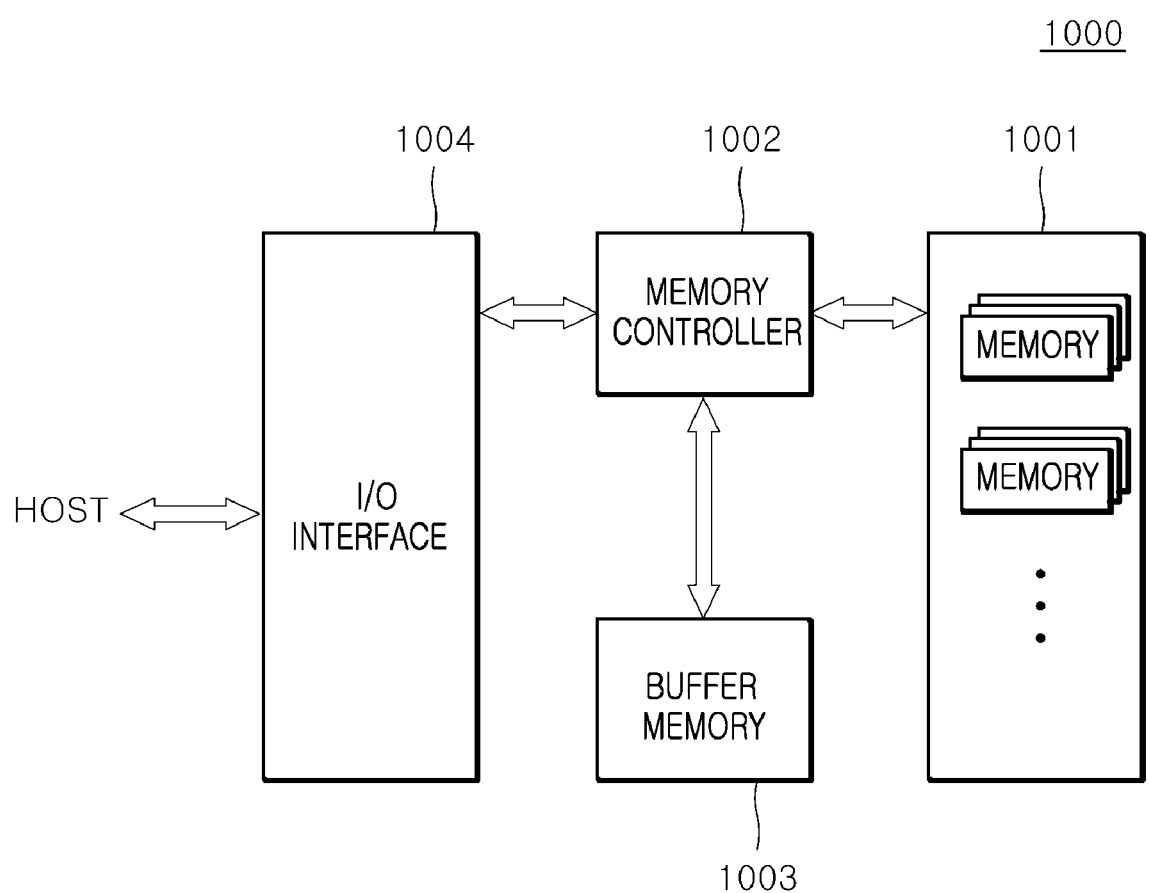
FIG. 14 is a block diagram illustrating a configuration of an electronic system including the semiconductor devices illustrated in FIGS. 1 to 13.

The semiconductor devices described with reference to FIGS. 1 to 13 may be applied to an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor devices illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    a refresh control circuit configured to generate test addresses that are counted in response to a refresh signal and a detection clock signal and configured to sense logic levels of internal data corresponding to the test addresses to generate a sense signal;
    a memory circuit configured to include a plurality of word lines which are selected by the test addresses and configured to output the internal data stored in memory cells connected to the word lines;
    an input control circuit configured to generate first and second main selection signals that are sequentially counted in response to the sense signal if any one of the test addresses has a predetermined level combination and configured to generate first and second sub-selection signals that are sequentially counted in response to the sense signal; and
    a weak cell address storage circuit configured to store a main group and a sub-group of each of the test addresses as a weak cell address in response to the first and second sub-selection signals regarding each of level combinations of the first and second main selection signals and configured to output a weak cell information signal according to the sense signal if the sub-group of the test address has a predetermined level combination.

2. The semiconductor device of claim 1, wherein the sense signal includes a pulse which is created if a logic level of the internal data is different from a predetermined logic level.

3. The semiconductor device of claim 1, wherein each of the test addresses includes position information on a weak cell; and wherein the weak cell has a data retention time which is shorter than a predetermined retention time.

4. The semiconductor device of claim 1, wherein the refresh control circuit includes:
    a test address generation circuit configured to generate the test addresses that are counted in response to the refresh signal and the detection clock signal; and
    a sensing circuit configured to sense a logic level of the internal data to generate the sense signal.

5. The semiconductor device of claim 1, wherein the input control circuit includes:

a control signal generation circuit configured to generate an initialization signal which is enabled if the sub-group of the test address has a predetermined level combination and configured to generate a control signal which is enabled in response to the initialization signal;
a main selection signal generation circuit configured to generate the first and second main selection signals that are counted in response to the initialization signal and the control signal; and
a sub-selection signal generation circuit configured to be initialized in response to the initialization signal and configured to generate the first and second sub-selection signals that are counted in response to the sense signal.

6. The semiconductor device of claim 5, wherein the control signal generation circuit includes:
    an initialization signal generation circuit configured to generate the initialization signal which is enabled if the sub-group of the test address has a predetermined level combination;
    a pull-up signal generation circuit configured to generate a pull-up signal including a pulse which is created in response to the initialization signal; and
    a driving circuit configured to generate the control signal which is disabled in response to the pull-up signal and which is enabled in response to the sense signal.

7. The semiconductor device of claim 1, wherein the weak cell address storage circuit includes:
    a decoder configured to decode the first and second main selection signals to generate first to fourth main input signals and configured to decode the first and second sub-selection signals to generate first to fourth sub-input signals;
    a first storage circuit configured to store the main group of each of the test addresses having a first level combination and the sub-group of the main group having the first level combination in response to the first to fourth sub-input signals if the first main input signal is enabled;
    a second storage circuit configured to store the main group of each of the test addresses having a second level combination and the sub-group of the main group having the second level combination in response to the first to fourth sub-input signals if the second main input signal is enabled;
    a third storage circuit configured to store the main group of each of the test addresses having a third level combination and the sub-group of the main group having the third level combination in response to the first to fourth sub-input signals if the third main input signal is enabled; and
    a fourth storage circuit configured to store the main group of each of the test addresses having a fourth level combination and the sub-group of the main group having the fourth level combination in response to the first to fourth sub-input signals if the fourth main input signal is enabled.

8. A semiconductor device comprising:
    a refresh control circuit configured to generate test addresses that are counted in response to a refresh signal and a detection clock signal and configured to sense logic levels of internal data corresponding to the test addresses to generate a sense signal;
    a memory circuit configured to include a plurality of word lines which are selected by the test addresses, configured to output the internal data stored in memory cells connected to the word lines, and configured to perform a refresh operation of weak cells according to a weak cell address in response to an internal refresh signal;

an input control circuit configured to generate first and second main selection signals that are sequentially counted in response to the sense signal if any one of the test addresses has a predetermined level combination and configured to generate first and second sub-selection signals that are sequentially counted in response to the sense signal;

an output control circuit configured to generate the internal refresh signal which is enabled and third and fourth main selection signals which are counted, in response to an enablement signal if the weak cell address and any one of the test addresses have the same level combination and configured to generate third and fourth sub-selection signals that are counted in response to the internal refresh signal if any one of the test addresses has a predetermined level combination; and a weak cell address storage circuit configured to store a main group and a sub-group of each of the test addresses in response to the first and second sub-selection signals regarding each of level combinations of the first and second main selection signals, configured to output a weak cell information signal according to the sense signal if the sub-group of the test address has a predetermined level combination, and configured to output each of the test addresses stored therein as the weak cell address in response to the third and fourth sub-selection signals regarding each of level combinations of the third and fourth main selection signals.

9. The semiconductor device of claim 8, wherein the sense signal includes a pulse which is created if a logic level of the internal data is different from a predetermined logic level.

10. The semiconductor device of claim 8, wherein each of the test addresses includes position information on a weak cell; and wherein the weak cell has a data retention time which is shorter than a predetermined retention time.

11. The semiconductor device of claim 8, wherein the refresh control circuit includes:
a test address generation circuit configured to generate the test addresses that are counted in response to the refresh signal and the detection clock signal; and
a sensing circuit configured to sense a logic level of the internal data to generate the sense signal.

12. The semiconductor device of claim 8, wherein the input control circuit includes:
a control signal generation circuit configured to generate an initialization signal which is enabled if the sub-group of the test address has a predetermined level combination and configured to generate a control signal which is enabled in response to the initialization signal;
a first main selection signal generation circuit configured to generate the first and second main selection signals that are counted in response to the initialization signal and the control signal; and
a first sub-selection signal generation circuit configured to be initialized in response to the initialization signal and configured to generate the first and second sub-selection signals that are counted in response to the sense signal.

13. The semiconductor device of claim 12, wherein the control signal generation circuit includes:
an initialization signal generation circuit configured to generate the initialization signal which is enabled if the sub-group of the test address has a predetermined level combination;

a pull-up signal generation circuit configured to generate a pull-up signal including a pulse which is created in response to the initialization signal; and
a driving circuit configured to generate the control signal which is disabled in response to the pull-up signal and which is enabled in response to the sense signal.

14. The semiconductor device of claim of 8, wherein the output control circuit includes:
an internal refresh signal generation circuit configured to compare the main group of any one of the test addresses with a main group of the weak cell address to generate a match signal and configured to generate the internal refresh signal in response to the match signal and the enablement signal;
a rest signal generation circuit configured to generate a reset signal which is enabled in response to the weak cell information signal or the internal refresh signal if the sub-group of the test address has a predetermined level combination;
a second main selection signal generation circuit configured to generate the third and fourth main selection signals that are counted in response to the match signal; and
a second sub-selection signal generation circuit configured to be initialized in response to the reset signal and configured to generate the third and fourth sub-selection signals that are counted if a sub-group of the weak cell address has a predetermined level combination or if the internal refresh signal is enabled.

15. The semiconductor device of claim of 14, wherein the internal refresh signal generation circuit includes:
a comparison signal generation circuit configured to compare the main group of the test address with the main group of the weak cell address to generate a comparison signal;
a match signal generation circuit configured to generate the match signal which enabled in response to the comparison signal and which is disabled in response to the reset signal; and
a logic circuit configured to generate the internal refresh signal which is enabled in response to the enablement signal and the match signal.

16. The semiconductor device of claim of 8, wherein the weak cell address storage circuit includes:
an input and output (input/output) (I/O) signal generation circuit configured to decode the first to fourth main selection signals to generate first to fourth main input signals and first to fourth main output signals and configured to decode the first to fourth sub-selection signals to generate first to fourth sub-input signals and first to fourth sub-output signals; and
a weak cell address generation circuit configured to store the test addresses in response to the first to fourth main input signals and the first to fourth sub-input signals and configured to output each of the stored test addresses as the weak cell address in response to the first to fourth main output signals and the first to fourth sub-output signals.

17. The semiconductor device of claim of 16, wherein the I/O signal generation circuit includes:
a first decoder configured to decode the first and second main selection signals to generate the first to fourth main input signals and configured to decode the first and second sub-selection signals to generate the first to fourth sub-input signals; and
a second decoder configured to decode the third and fourth main selection signals to generate the first to fourth main output signals and configured to decode the third and fourth sub-selection signals to generate the first to fourth sub-output signals.

18. The semiconductor device of claim of 16, wherein the weak cell address generation circuit includes:
- a first storage circuit configured to store the main groups of each of the test addresses having a first level combination and the sub-groups included in the test addresses in response to the first to fourth sub-input signals if the first main input signal is enabled and configured to output each of the stored test addresses as the weak cell address in response to the first to fourth sub-output signals if the first main input signal is enabled;
- a second storage circuit configured to store the main groups of each of the test addresses having a second level combination and the sub-groups included in the test addresses in response to the first to fourth sub-input signals if the second main input signal is enabled and configured to output each of the stored test addresses as the weak cell address in response to the first to fourth sub-output signals if the second main input signal is enabled;
- a third storage circuit configured to store the main groups of each of the test addresses having a third level combination and the sub-groups included in the test addresses in response to the first to fourth sub-input signals if the third main input signal is enabled and configured to output each of the stored test addresses as the weak cell address in response to the first to fourth sub-output signals if the third main input signal is enabled; and
- a fourth storage circuit configured to store the main groups of each of the test addresses having a fourth level combination and the sub-groups included in the test addresses in response to the first to fourth sub-input signals if the fourth main input signal is enabled and configured to output each of the stored test addresses as the weak cell address in response to the first to fourth sub-output signals if the fourth main input signal is enabled.

19. The semiconductor device of claim of 18, wherein the first to fourth storage circuits output the weak cell information signal which is enabled in response to the sense signal if the sub-group of the test address has a predetermined level combination.

* * * * *